(12) United States Patent
Araki

(10) Patent No.: US 7,833,941 B2
(45) Date of Patent: Nov. 16, 2010

(54) OXIDE SUPERCONDUCTOR AND METHOD FOR PRODUCING THE SAME

(75) Inventor: Takeshi Araki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 11/857,089

(22) Filed: Sep. 18, 2007

(65) Prior Publication Data

US 2008/0139393 A1    Jun. 12, 2008

(30) Foreign Application Priority Data

Nov. 30, 2006    (JP)    ............................. 2006-324620

(51) Int. Cl.
*H01B 12/00*    (2006.01)
*H01L 39/12*    (2006.01)

(52) U.S. Cl. ...................................... 505/123; 505/235
(58) Field of Classification Search ................. 505/123, 505/235–238; 428/701–702
See application file for complete search history.

(56) References Cited

U.S. PATENT DOCUMENTS

| | | | |
|---|---|---|---|
| 6,586,042 B2 | 7/2003 | Araki et al. | |
| 6,610,428 B2 * | 8/2003 | Smith et al. | 428/701 |
| 6,673,387 B1 * | 1/2004 | Zhang et al. | 427/62 |
| 6,821,930 B2 | 11/2004 | Araki et al. | |
| 7,615,515 B2 * | 11/2009 | Araki et al. | 505/123 |
| 7,622,424 B2 * | 11/2009 | Li et al. | 505/235 |
| 2006/0058195 A1 | 3/2006 | Araki et al. | |

FOREIGN PATENT DOCUMENTS

| | | |
|---|---|---|
| JP | 2006-44963 | 2/2006 |
| JP | 2006-83022 | 3/2006 |
| WO | WO 02/35615 A2 | 5/2002 |

OTHER PUBLICATIONS

Araki et al "High-Critical-Temperature Sm- and Nd- based Superconductors Produced by Metal Organic Deposition Using Trifluoroacetates and Pentafluoroacetates", JJAP 44(36), pp. L1138-L1140 2005.*

P.M. Mankiewich, et al., "Reproducible technique for fabrication of thin films of high transition temperature superconductors", Appl. Phys. Lett., vol. 51, No. 21, American Institute of Physics, Nov. 23, 1987, pp. 1753-1755.

(Continued)

*Primary Examiner*—Mark Kopec
(74) *Attorney, Agent, or Firm*—Oblon, Spivak, McClelland, Maier & Neustadt, L.L.P.

(57) ABSTRACT

An oxide superconductor film formed on a substrate includes an oxide containing at least one metal M selected from the group consisting of yttrium and lanthanoid metals, provided that cerium, praseodymium, and promethium are excluded, and barium and copper, in which the film has an average thickness of 350 nm or more, an average amount of residual carbon of $3 \times 10^{19}$ atoms/cc or more, and an amount of residual fluorine in a range of $5 \times 10^{17}$ to $1 \times 10^{19}$ atoms/cc, and in which, when divided the film into a plurality of regions from a surface of the film or from an interface between the film and the substrate, each region having a thickness of 10 nm, atomic ratios of copper, fluorine, oxygen and carbon between two adjacent regions are in a range of 1/5 times to 5 times.

6 Claims, 12 Drawing Sheets

OTHER PUBLICATIONS

Takeshi Araki, et al., "Review of a chemical approach to YBa$_2$Cu$_3$O$_{7-x}$-coated superconductors-metalorganic deposition using trifluoracetates", Supercond. Sci. Technol. 16, Institute of Physics Publishing, Superconductor Science and Technology, Sep. 18, 2003, pp. R71-R94.

* cited by examiner

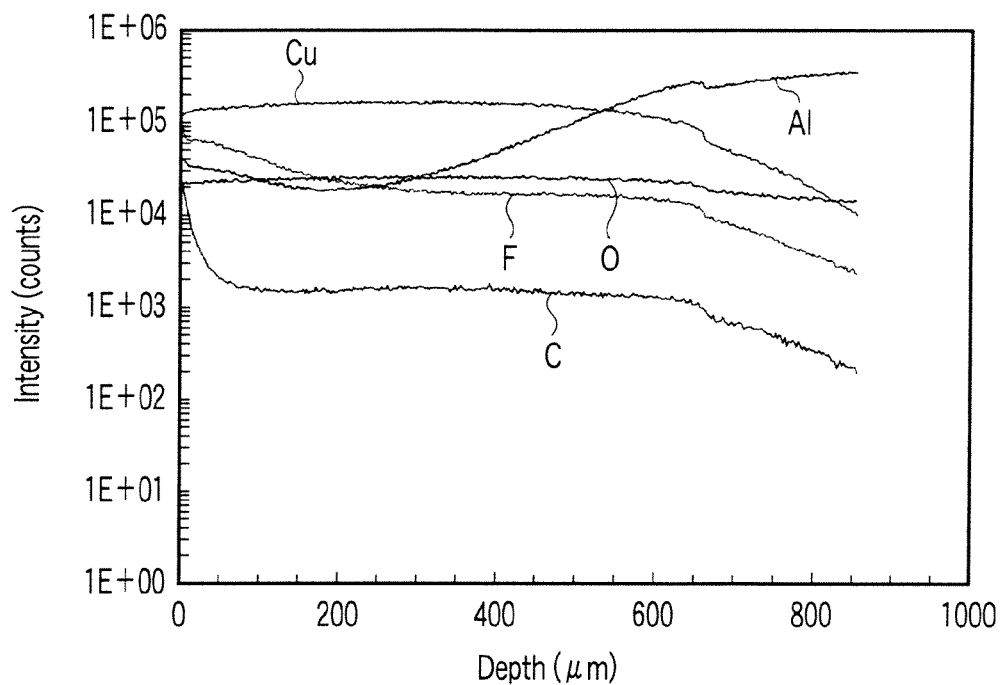
F I G. 7
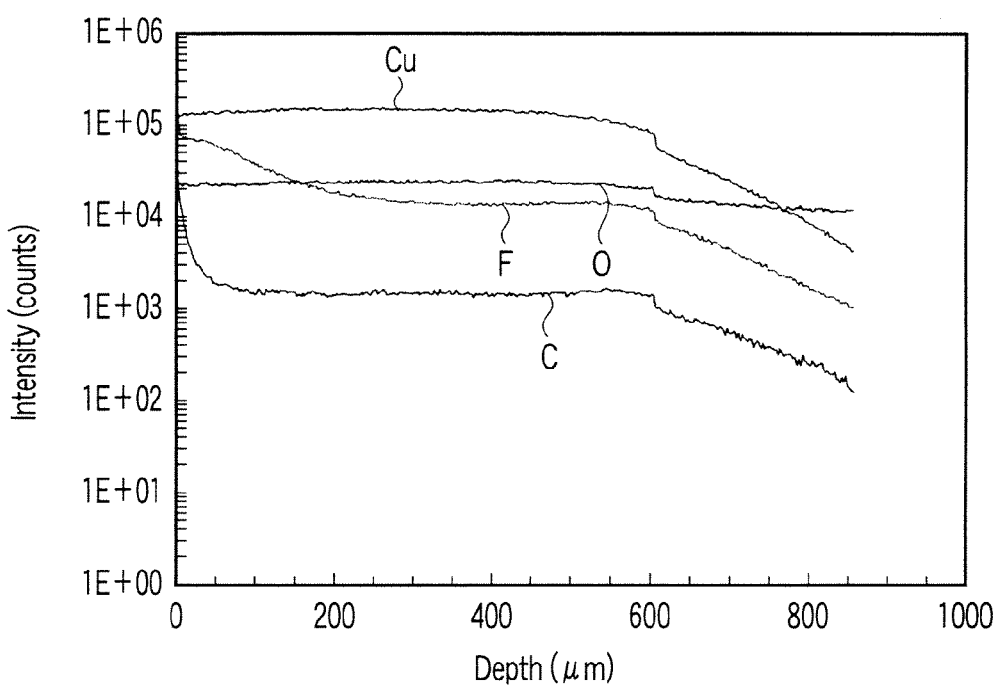
F I G. 8

OXIDE SUPERCONDUCTOR AND METHOD FOR PRODUCING THE SAME

CROSS-REFERENCE TO RELATED APPLICATIONS

This application is based upon and claims the benefit of priority from prior Japanese Patent Application No. 2006-324620, filed Nov. 30, 2006, the entire contents of which are incorporated herein by reference.

BACKGROUND OF THE INVENTION

1. Field of the Invention

The present invention relates to an oxide superconductor and a method for producing the same.

2. Description of the Related Art

High critical-current oxide superconductor materials that have been developed in recent years are expected to be usefully applied, for example, to fusion reactors, magnetically levitated trains, particle accelerators, magnetic resonance imaging apparatuses (MRI) and microwave filters, and some of these technologies have been already used in practical fields.

Major oxide superconductors are bismuth-based, yttrium-based and thallium-based superconductors. Of these materials, yttrium-based superconductors have been attracting much attention as almost practically applicable materials since they exhibit the highest superconducting properties in a magnetic field at a liquid nitrogen temperature and can be used for magnetic levitated trains by cooling with liquid nitrogen.

The yttrium-based superconductor is expressed by a formula $YBa_2Cu_3O_{7-x}$, and has a perovskite structure. Compounds in which yttrium is replaced with a lanthanoid group rare earth element, and mixtures thereof have been also known to exhibit superconducting properties. Examples of the method of producing these superconducting materials so far used include pulsed laser deposition (PLD), liquid phase epitaxy (LPE), electron beam (EB) processing, and metal organic deposition (MOD).

The methods of producing the superconducting material are roughly classified into an in situ process and an ex situ process. The in situ process performs deposition of metals essential for producing the superconductor and formation of a superconductor by oxidation the metals at once. The ex situ process independently performs deposition of metals essential for forming the superconductor and heat treatment for forming the superconductor. Accordingly, a precursor (calcined film) is formed in the ex situ process.

The in situ processes were paid attention as the production methods of the superconductor in the early stage. This is because the in situ processes were expected to make cost lowered due to its small number of production steps. However, production conditions are hard to be controlled in the processes since all the deposition conditions must be controlled at once, which has been revealed that good superconductors can hardly be obtained. On the other hand, although the ex situ process was afraid to increase the production cost, it has been possible to substantially reduce the production cost by developing a non-vacuum method such as an MOD method and a TFA-MOD method to be described below. It is an advantage of the ex situ process over the in situ process to divide the heat treatment into two steps in order to facilitate control of heat treatment.

Examples of the ex situ process include the EB processing (P. M. Mankiewich et al., Appl. Phys. Lett. 51, 1987, 1753-1755), MOD method, and TFA-MOD method (T. Araki and I. Hirabayashi, Supercond. Sci. Techol. 16, 2003, R71-R94).

In the EB processing, a precursor containing metals essential for the superconductor is deposited by electron beam, and a Y-based superconductor is then produced by applying a heat treatment (firing). A superconducting layer is supposed to be developed in the firing process via a quasi-liquid phase network in the presence of fluorine. Since no carbon is used in this method, there is no residual carbon at all in the superconductor obtained, and superconducting properties are not largely impaired. However, the EB processing involves a problem of high production cost.

The MOD method is a method that has been investigated in another field and is used in the production of the superconductor. While much effort has been made in order to reduce harmful residual carbon in the production of the Y-based superconductor by the MOD method, there is no effective method for reducing the residual carbon. Since organic substances in the precursor are decomposed by calcining in this method, the film obtained is also called a calcined film. The calcined film contains metal oxides and residual carbon and does not contain fluorine at all. The fired film also contains the metal oxides and residual carbon.

The TFA-MOD method derived from the MOD method will be finally described. A carbon expulsion scheme works during calcining by using trifluoroacetic acid (TFA) as a fluorine-containing compound in this method, and a calcined film from which most of carbon harmful for superconductor is expelled is readily obtained. It has been known that a highly oriented texture in an atomic level is formed with good reproducibility during the firing process, by forming a quasi-liquid phase network by the action of fluorine and by a chemical equilibrium reaction. Since no vacuum process is used at all from deposition to calcining and firing to enable the production cost to be reduced, research of this method has been spread worldwide. A wire material that enables 70A of current with a wire having a length of 100 m can be produced with good reproducibility today. Consequently, the TFA-MOD method is a major process in the production of the yttrium-based superconductor.

However, while the TFA-MOD method has a large advantage that a superconductor exhibiting excellent superconducting properties may be produced with a low production cost, it is disadvantageously difficult to increase the thickness of the film. This is because reduction in the volume of the film is as large as 87% from a gel film to a final superconducting film in this process and a stress (drying stress) in the direction parallel to the substrate surface may be applied to the film during reduction in the volume, cracks are produced in the film when the film has a certain thickness (critical thickness) or more even by applying a moderate heat treatment. While a high-purity solution from which impurities are reduced as much as possible is usually used for obtaining a superconductor having excellent superconducting properties, the critical thickness in this case is about 300 nm. For example, when a superconductor with a thickness of 350 nm is formed on a substrate with a diameter of 2 inches, it has been confirmed that cracks with a width of 0.1 mm or more and a length of 1 mm or more that may be readily recognized by visual observation are formed.

Increasing the thickness of the superconductor will be described here. In the usual MOD method, the thickness of the film is increased by repeating the process of coating to form a gel film followed by calcining. The reason why such a process can be used is that the calcining is completed in a quite short period of time. However, it has been known that fatal degradation in superconducting properties is caused due to an increased amount of residual carbon when the thickness of the superconductor is increased by repeated coatings in the MOD method. On the other hand, in the TFA-MOD method, a gradually increasing time sufficient for breaking covalent bonds is necessary in the calcining step for decomposing organic substances by calcining while the organic substance is prevented from being burnt, and the longest time is spent in the entire process for calcining. Accordingly, a quite long time of heat treatment is necessary for increasing the thickness of the superconductor when coating is repeated in the TFA-MOD method. Homogeneity of the superconducting film is lost due to local crystallization when the film experiences many times of heat hysteresis, and the quality of the film is gradually degraded. In addition, it has been known that superconducting properties are degraded by repeated coatings since an oxide layer is formed at the boundary between the lower layer and upper layer formed by repeated coatings. In particular, increasing the thickness by repeated coatings causes a critical effect in the application of the superconductor for a microwave filter. Usually, a superconductor with a thickness of 400 nm or more is assumed to be necessary for the microwave filter, and a thick superconductor that maintains excellent superconducting properties is necessary particularly in a signal transmission side. However, since intermediate oxide layers are formed by repeated coatings as described above, adjustment of filter characteristics becomes quite difficult due to the oxide as a cause of loss to make it difficult to produce a sharp-cut filter. Accordingly, it is important to obtain a thick superconductor that exhibits excellent superconducting properties by single coating in the TFA-MOD method, in order to prevent superconducting properties from being degraded by long term heat treatment and by formation of oxide layers.

Next, a method for thickening the superconductor by single coating will be described below. In the usual MOD method, an organic compound having a longer chain is added to a metal organic compound containing essential metals for forming the superconductor. In this case, the film is prevented for cracks from being produced by taking advantage of the fact that the added organic compound is not decomposed at a low temperature for decomposing the metal organic compound that contains the essential metals. The added organic compound is decomposed thereafter at a higher temperature. The film thickness may be practically increased by using such a method. However, residual carbon originating from the added organic compound is a problem in the MOD method. On the other hand, it has been found in recent years that, when the same method is used in the TFA-MOD method, residual fluorine is problematic rather than residual carbon by virtue of the action of the carbon expulsion scheme. While a certain extent of fluorine is necessary in the TFA-MOD method for forming a quasi-liquid phase network in the firing process, the content of residual fluorine accounts for about 10 to 20 times when the same organic compounds as used in the MOD method are added as compared with the case when no such organic compound is added. It has been also anticipated that fluorine may be eliminated by keeping the firing condition for a long term since fluorine is eliminated when the quasi-liquid phase network is formed. However, it has been found that a minute amount of a texture of a Y-based superconductor in which fluorine compounds are mixed is formed by keeping the superconductor under the firing condition for a long period of time. The fluorine compound is recrystallized into barium fluoride during cooling, which leads to disturbance of crystal orientation. Actually, a superconductor has superconducting properties 1/10 or less of the original level when just a minute amount of $BaF_2$ is detected by XRD measurement of the superconductor. Further, when the organic compound is added, the amount of residual fluorine increases by increasing the thickness of the film formed by single coating. This may be believed that fluorine existing at the bottom of the coating film is not eliminated.

Rupich et al have proposed a method for preventing the fluorine content in the oxide superconductor from increasing by using Cu carboxylate containing less fluorine in place of Cu trifluoroacetate without adding any fluorine-containing organic compounds (WO 2002/035615). Cu carboxylate used in this method contains, for example, chlorine, bromine or hydrogen in place of fluorine. However, since the solution used by Rupich et al is not a high-purity solution prepared by a Solvent-Intro-Gel method, it may be supposed that a certain amount of acetate salt remains already, which possibly increases the amount of residual fluorine.

While J. A. Smith et al have reported a superconductor having a thickness of as large as 1,000 nm, superconducting properties are not so high and the details of the production method are indefinite.

BRIEF SUMMARY OF THE INVENTION

According to an aspect of the present invention, there is provided an oxide superconductor film formed on a substrate, comprising: an oxide containing at least one metal M selected from the group consisting of yttrium and lanthanoid metals, provided that cerium, praseodymium, and promethium are excluded, and barium and copper, wherein the film has an average thickness of 350 nm or more, an average amount of residual carbon of $3 \times 10^{19}$ atoms/cc or more, and an amount of residual fluorine in a range of $5 \times 10^{17}$ to $1 \times 10^{19}$ atoms/cc, and wherein, when divided the film into a plurality of regions from a surface of the film or from an interface between the film and the substrate, each region having a thickness of 10 nm, atomic ratios of copper, fluorine, oxygen and carbon between two adjacent regions are in a range of 1/5 times to 5 times.

According to another aspect of the present invention, there is provided a method for producing an oxide superconductor, comprising: preparing a coating solution by mixing a methanol solution in which corresponding fluorocarboxylate salts are contained so as to set an atomic ratio of metal M selected from the group consisting of yttrium and lanthanoid metals, provided that cerium, praseodymium, and promethium are excluded, and barium and copper to be approximately 1:2:3 with an organic substance having a ratio of fluorine/(fluorine and hydrogen) in a range of 75 to 96 mol %; forming a gel film by coating the coating solution on a substrate; and forming a film of an oxide superconductor by calcining, firing and oxygen-annealing the gel film.

BRIEF DESCRIPTION OF THE SEVERAL VIEWS OF THE DRAWING

FIG. 7 is a graph showing a SIMS profile of a superconducting film formed on the front surface of the substrate in Example 2;

FIG. 8 is a graph showing a SIMS profile of a superconducting film formed on the back surface of the substrate in Example 2;

DETAILED DESCRIPTION OF THE INVENTION

Figure 1:
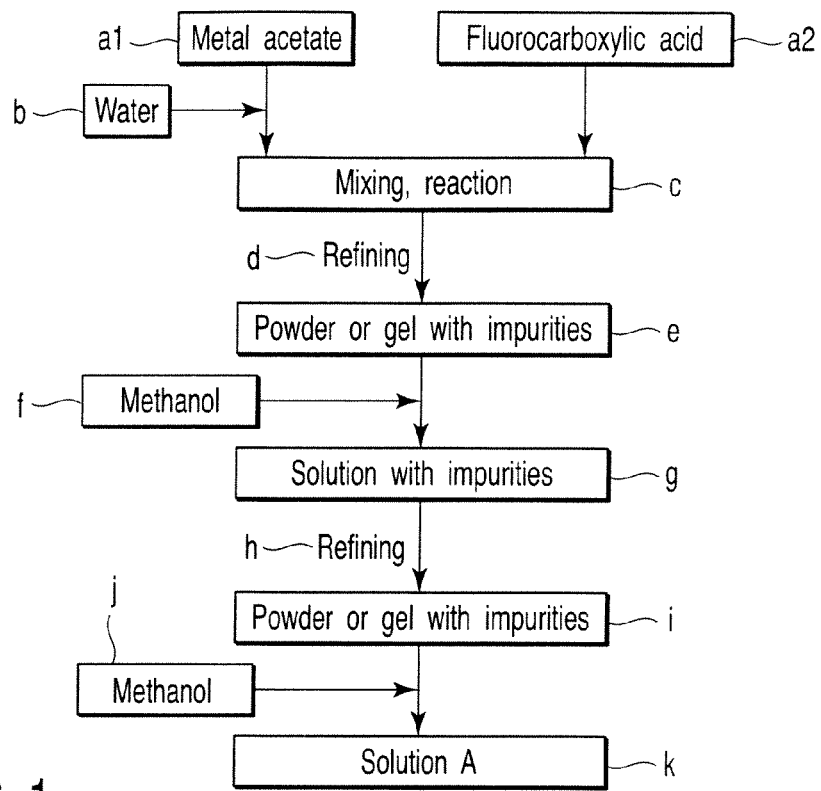
FIG. 1 is a flowchart for preparing a high-purity solution according to an embodiment.

In the method of producing an oxide superconductor according to an embodiment of the invention, a coating solution used is a methanol solution of a fluorocarboxylic acid salt containing metal M, barium and copper to which an organic compound with a fluorine/(fluorine and hydrogen) ratio in the range of 75 to 96 mol % is added. So far, there have been no attempts to add an organic compound containing a large amount of fluorine to the coating solution. This is because the amount of residual fluorine is supposed to increase by this method.

The present inventors have elucidated that many phenomena in the TFA-MOD method may be interpreted by a carbon expulsion scheme in the calcining process and by formation of a texture based on a quasi-liquid phase network model in the firing process. For taking advantage of these two mechanisms, a long chain fluorocarboxylic acid has been suggested as a substance that is able to suppress the amount of residual fluorine from increasing in the superconductor while esterification reactions in solution preparing processes are prevented.

An outline of the reason why the long chain fluorocarboxylic acid is advantageously used is as follows. When an organic compound containing many atoms other than fluorine such as hydrogen is used, decomposed fluorine compounds remain within the film up to a higher temperature since the decomposed fluorine compounds form hydrogen bonds with the organic compound. Since fluorine replaces oxygen according to the carbon expulsion scheme, the amount of residual fluorine increases when a lot of fluorine compounds remain for a longer period of time. Accordingly, it is important that the fluorine compounds formed in the calcining process do not form hydrogen bonds in order to prevent increase in residual fluorine.

While atoms having electronegativity close to that of fluorine may be expected to cause no interaction with fluorine, there are no other atoms having electronegativity close to that of fluorine having the strongest electronegativity among all the atoms. However, it may be supposed that interaction with the fluorine compound formed in the calcining process may be excluded by using an additive containing fluorine itself. When a long chain fluorocarboxylic acid is added as the additive, that additive is decomposed at 200 to 250° C. that is a retention temperature for the calcining process, while the decomposed product does not strongly interact with surrounding fluorine compounds originating from trifluoroacetic acid by forming, for example, hydrogen bonds. The additives decomposed by calcining are reduced into small molecular weight compounds, and are gasified and dissipated into air stream. It is effective for reducing the amount of residual fluorine in the finally obtained superconductor to add, as the additive, an organic compound that contains a large amount of fluorine and few or no hydrogen. However, all the atoms bonded in an organic chain are not necessarily fluorine, and there is no problem when hydrogen is bonded to a part of the chain. Small amount of hydrogen surrounded by a large amount of fluorine causes no problem since hydrogen is dissipated by forming hydrogen fluoride. It has been disclosed in this invention that the number of the hydrogen atoms ⅓ or less of the number of fluorine atoms in the additive, or a proportion of F/(F+H) of 75 mol % or more, is effective for reducing the amount of residual fluorine. A thick superconducting film that contains a small amount of residual fluorine and exhibits excellent superconducting properties may be obtained by adding a fluorine compound to a high-purity coating solution as the additive.

Since the long chain fluorocarboxylic acid added as the additive is decomposed at a temperature different from the decomposition temperature of trifluoroacetic acid, cracks may be prevented from emerging in the calcined film. Fluorine compounds formed by cleaving organic chains are dissipated in air stream as a gas without interacting with other substances. Consequently, since oxygen bonded to metals constituting the superconductor is not replaced with fluorine, the amount of residual fluorine in the superconducting film may be specifically reduced to obtain a superconducting film that exhibits excellent superconducting properties.

The amount of the additive added to the coating solution, which is revealed to be effective for increasing the thickness, is in the range of 2.5 to 20 wt % for a standard solution having a molar concentration of metal ions of ⅓ mol/L. It has been shown from detailed investigations of various additives that the amount of the additive is related to a weight ratio, not to the molar ratio. It has been also known that the addition amount of the additive may be increased in proportion to the concentration of metal ions when the metal ion concentration in the coating solution is different. For example, when a solution having a molar concentration of the metal ions of 2.1 mol/L is used, which is 40% higher than the concentration in the above standard solution, the addition amount of the additive may be also 40% higher than the above-mentioned range. This shows that the proportion of the solute and additive that constitute the gel film may fall within a specified ratio in the gel film after coating. The weight of the solute is approximated by the weight of the solution, because the volume decreases when methanol is mixed with trifluoroacetate salt as the solute and an accurate weight of the solute per unit volume cannot be determined.

The reason why the effect of disregarding the weight of methanol is not so large may be appreciated from the following reason. The upper limit of the metal ion concentration in a mixed trifluoroacetate salt is from about 2.9 to about 3.0 mol/L. However, since using a high concentration of solution tends to increase the stress of the gel film, the upper limit of the practically available metal ion concentration is in the range of about 2.7 to about 2.8 mol/L. This concentration is less than twice of the metal ion concentration of 1.5 mol/L of the standard solution. On the other hand, the lower limit of the metal ion concentration of mixed trifluoroacetate salt is 0.75 ml/L, since a thick gel film is hardly obtained even under an optimum coating condition when the concentration is lower than 0.75 ml/L. Thus, the lower limit of the metal ion concentration is about 0.5 times the concentration of the standard solution of 1.5 mol/L. Accordingly, the effective addition amount may be roughly estimated by approximating the addition amount of the additive as a ratio to the weight of the solution. Since the specific gravity of the mixed trifluoroacetate salt containing yttrium is about 2.4 g/ml while the specific gravity of methanol is 0.79 g/ml, the contribution of methanol that has a light weight in the solution is small. This may be also a reason why the effect of disregarding the weight of methanol is negligible.

Since the critical thickness is about 350 nm when the addition amount of the additive to the coating solution having a standard concentration is 2.5 wt %, the thickness of the superconducting film cannot be increased at an addition amount less than the above-mentioned value. Most of the additives can contribute to form a precursor (calcined film) of a superconducting film with a thickness of as large as about 3,000 nm at a concentration of about 10 wt %. Good superconducting properties are hardly obtained when the addition amount of the additive exceeds 20 wt % since the proportion of the additive in the film increases.

A calcined film with a thickness of 700 nm or more and a fired film (superconducting film) with a thickness of 350 nm or more may be obtained by single coating without incorporation of an oxide layer by using the method according to an embodiment of the invention. In particular, excellent superconducting properties are obtained in the fired film (superconducting film) with a thickness of 650 nm obtained from a calcined film with a thickness of 1,300 nm. A calcined film with a thickness of 2,900 nm (corresponding to 1,450 nm after firing) having no discontinuous planes for the distribution of the composition is also obtained. The oxide superconductor film preferably has an average thickness of 600 nm or more. The oxide superconductor film more preferably has an average thickness of 1,250 or more. While superconducting properties are not obtained in a thick film due to emergence of a lot of a/b-axis oriented grains since the film is deposited on $LaAlO_3$ at present, a superconducting film having excellent superconducting properties may be expected by forming the film on an intermediate layer on which grains oriented in a/b axis are hardly formed in the firing process.

The method for producing the oxide superconductor according to an embodiment of the invention will be described in more detail.

The method for preparing a high-purity solution by allowing the metal acetate salt to react with fluorocarboxylic acid will be described with reference to FIG. 1. The metal acetate salt (a1) in FIG. 1 is a collective name of acetate salt of metal M, barium acetate and copper acetate. Each metal acetate salt (a1) is dissolved in water (b), and mixed with fluorocarboxylic acid (a2). These solutions are allowed to react by mixing so that the proportion of metal ions is 1:2:3 in molar ratio (c), the mixed solution is purified (d) by allowing impurities to evaporate in vacuum, and a powder or gel (e) containing impurities is obtained.

While a fluorocarboxylic acid having two carbon atoms, for example trifluoroacetic acid (TFA), is used as the fluorocarboxylic acid (a2), other appropriate fluorocarboxylic acids may be used depending on the kind of the metal acetate salt. For example, a metal acetate salt containing a metal M and copper acetate may be allowed to react with the fluorocarboxylic acid having two carbon atoms as well as with a fluorocarboxylic acid having three or more carbon atoms, for example pentafluoropropionic acid. In particular, a metal acetate salt containing a metal M selected from the group consisting of lanthanum, neodymium and samarium is preferably made to react with a fluorocarboxylic acid having three or more carbon atoms. However, since barium acetate forms a precipitate by reacting with the fluorocarboxylic acid having three or more carbon atoms, it is made to react with the fluorocarboxylic acid having two carbon atoms, for example TFA.

Examples of the fluorocarboxylic acid having two carbon atoms include trifluoroacetic acid (TFA), monofluoroacetic acid (MFA) and difluoroacetic acid (DFA). Examples of the fluorocarboxylic acid having three or more carbon atoms include pentafluoropropionic acid (PFP), heptafluorobutanoic acid (HFB) and nonafluoropentanoic acid (NFP).

The gel or powder is purified thereafter by Solvent-Into-Gel (SIG) method. Specifically, an impurity (for example water) is replaced with methanol by adding methanol to the powder or gel (e) containing impurities, the powder or gel is purified (h) by permitting methanol and impurity to dissipate from the solution (g) containing the impurities, and a powder or gel containing a solvent (i) is obtained. A high-purity solution (k) is obtained by adding methanol (j) to the powder or gel (i) containing the solvent again.

Figure 2:
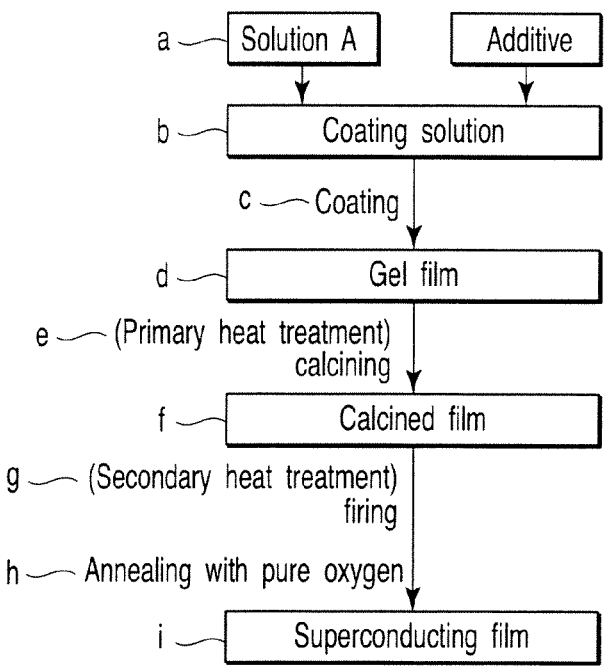
FIG. 2 is a flowchart for producing a superconductor according to an embodiment.

The method for obtaining an oxide superconductor will be described below with reference to FIG. 2. Solution A is prepared by mixing respective high-purity solutions so that the molar ratio of metal M, barium and copper is 1:2:3, and coating solution B is prepared (b) by adding an organic compound (a) with a fluorine/(fluorine+hydrogen) ratio in the range of 75 to 96 mol % as an additive. A gel film (d) is formed by deposition (c) of the coating solution (B) on a substrate, a calcined film (f) containing a metal oxy-fluoride is formed by calcining (e) as a primary heat treatment, and an oxide superconductor (i) is obtained by applying firing (g) as a secondary heat treatment and annealing (h) in pure oxygen.

Figure 3:
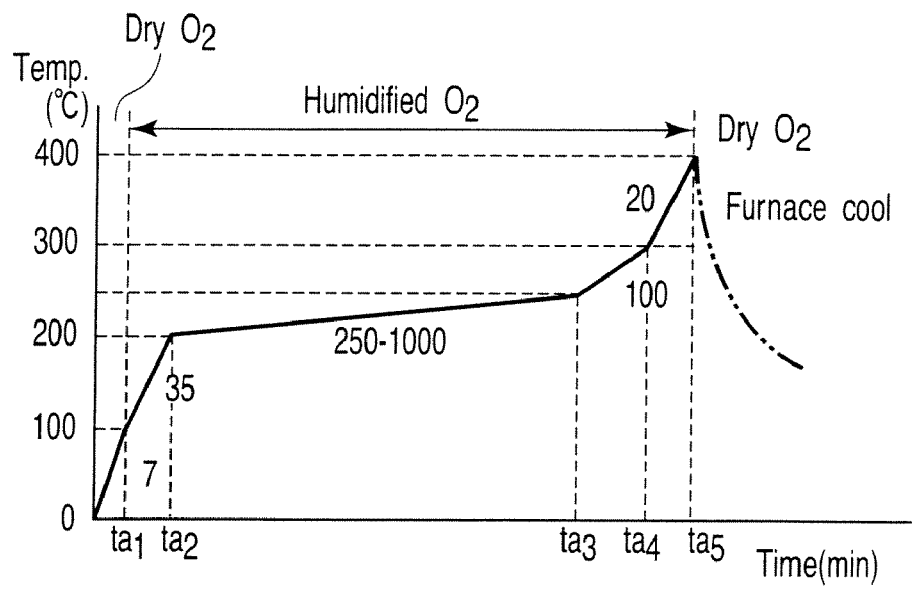
FIG. 3 is a graph showing a temperature profile in a calcining process according to an embodiment.

FIG. 3 shows an example of the temperature profile (and atmosphere) in the calcining process.

(1) The temperature in the heat treatment furnace is rapidly increased from room temperature to 100° C. within a period from time 0 to $t_{a1}$ (about 7 minutes from the start of heat treatment). The inside of the heat treatment furnace is under a dry oxygen atmosphere at an ambient pressure in this step. All the heat treatment steps thereafter may be performed under an atmospheric pressure.

(2) The atmosphere in the heat treatment furnace is changed to a moist pure oxygen atmosphere of an ambient pressure at time $t_{a1}$. The temperature in the heat treatment furnace is increased from 100° C. to a temperature range from 170 to 230° C. during the interval from time $t_{a1}$ to $t_{a2}$ (about 42 minutes from the start of the heat treatment). The relative humidity of the moist pure oxygen atmosphere is set, for example, in the range of 1.2 to 12.1%. The above-mentioned humidity corresponds to a dew point of 10° C. and 50° C., respectively. The humidity is controlled by the saturated water vapor pressure in bubbles by passing the atmosphere gas (oxygen gas) through water at a predetermined temperature, i.e. the saturated water vapor pressure is determined by the temperature. For setting the dew point temperature of the corresponding humidity to be lower than room temperature, the atmosphere gas flow is split to permit only a part of bubbles of the atmosphere gas to pass through water followed by allowing the split gas stream to join the main gas stream. The object of moistening is to prevent copper fluoroacetate from being sublimed by converting copper fluoroacetate that is most readily sublimed into an oligomer by partial hydrolysis in order to increase the apparent molecular weight of copper fluoroacetate. When fluoroacetic acid is trifluoroacetic acid, in the hydrolysis reaction that proceeds as follows, a hydrogen bond is formed between the F atom and H atom at both terminals of the copper salts, and sublimation is suppressed by increasing the apparent molecular weight by linking 4 to 5 molecules.

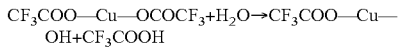

$CF_3COO$—$Cu$—$OCOCF_3$+$H_2O$→$CF_3COO$—$Cu$—$OH$+$CF_3COOH$ (3) The temperature in the furnace is slowly increased to the range of 220 to 280° C. in an interval from $t_{a2}$ to $t_{a3}$ (from about 4 hours and 10 minutes to about 16 hours and 40 minutes). The temperature is slowly increased in order to prevent carbon components from being left behind due to combustion of the partially hydrolyzed salt as a result of abrupt reaction. Covalent bonds in the salt are cleaved by a long term decomposition reaction, metal oxides ($Y_2O_3$, BaO, CuO) are temporarily formed, a part of oxygen is replaced with F in $Y_2O_3$ and BaO, and non-stoichiometric compounds of Y or Ba with oxygen and fluorine are formed. When the reaction slowly proceeds while the temperature is gradually increased, only grains of CuO as a single substance are grown into nano crystalline crystals with a diameter of several tens of nanometers, while Y and Ba components having a non-stoichiometric ratio between fluorine and oxygen remain amorphous without grain growth.

(4) The temperature in the heat treatment furnace is increased from the range of 220 to 280° C. to 400° C. from time $t_{a3}$ to $t_{a4}$ and from time $t_{a4}$ to $t_{a5}$ (a time interval of about 2 hours, respectively). While unnecessary organic substances formed by decomposition during time $t_{a2}$ to time $t_{a3}$ are left behind by forming hydrogen bonds, they are eliminated in this step.

(5) The furnace is cooled by flowing a gas at time $t_{a5}$ and thereafter. A calcined film is thus obtained.

Figure 4:
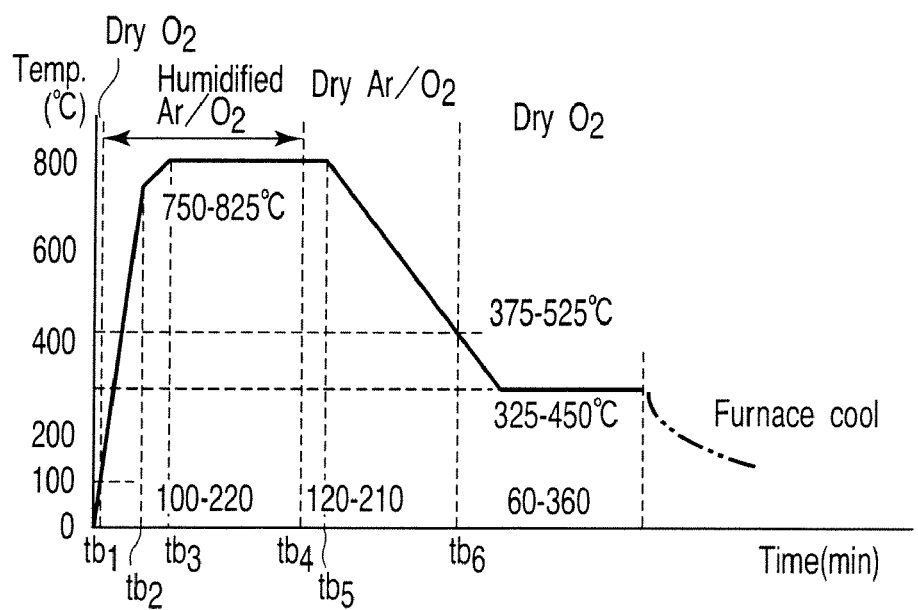
FIG. 4 is a graph showing a temperature profile in a firing process according to an embodiment.

The calcined film obtained is fired and annealed in pure oxygen in the electric furnace to produce an oxide superconductor. An example of the temperature profile (and atmosphere) during the firing process is shown in FIG. 4.

(6) The temperature in the heat treatment furnace is rapidly increased from room temperature to 100° C. during time 0 to $t_{b1}$ (about 7 minutes from the start of the heat treatment). The inside of the heat treatment furnace is kept under an $Ar/O_2$ gas atmosphere at an ambient pressure. The oxygen concentration is selected to be an optimum concentration depending on the metal species of the superconductor to be fired and firing temperature. For example, when a Y-based material ($YBa_2Cu_3O_{7-x}$) is fired at 800° C., the optimum heat treatment condition is to set an initial oxygen partial pressure at 1000 ppm, and the oxygen concentration is approximately halved for every temperature decrease of 25° C. While the oxygen concentration is also approximately halved for every temperature decrease of 25° C. in La-based, Nd-based and Sm-based materials, the partial pressure of oxygen for firing at 800° C. is preferably 1 ppm, 5 ppm and 20 ppm, respectively. All the heat treatment steps thereafter may be applied under an ambient pressure.

(7) The temperature in the heat treatment furnace is increased to a highest temperature of 750° C. to 825° C. during time $t_{b1}$ to time $t_{b2}$ (about 33 minutes to 37 minutes, heated at a heating rate of about 20° C./min until the highest temperature is reached) and during time $t_{b2}$ to time $t_{b3}$ (about 5 minutes). The dry gas is moistened at time $t_{b1}$ by the same method as in calcining. The moistening ratio in this step may be selected in a wide range of 1.2% (dew point 10° C.) to 30.7% (dew point 70° C.). The reaction rate increases by increasing the moistening ratio. The rate of increase is estimated to be proportional to 0.5 power of moistening ratio. The heating rate during time $t_{b2}$ to time $t_{b3}$ is small in order to suppress overheating of the electric furnace at time $t_{b3}$. A quasi-liquid phase begins to form by the action of water vapor at a temperature of about 650° C., and a network of the quasi-liquid phase is formed in the film.

(8) $MBa_2Cu_3O_6$ is sequentially formed on the substrate from the quasi-liquid phase network during time $t_{b3}$ to time $t_{b4}$ (from about 45 minutes to about 3 hours and 40 minutes; this time interval depends on the highest temperature and final thickness, and is the longest when the temperature is low and the thickness of the film is large) with simultaneous emission of HF gas. The chemical reaction of this step may be simply represented as:

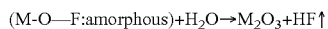

(M-O—F:amorphous)+$H_2O$→$M_2O_3$+HF↑

(Ba—O—F:amorphous)+$H_2O$→BaO+HF↑

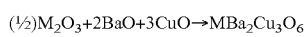

(½)$M_2O_3$+2BaO+3CuO→$MBa_2Cu_3O_6$ (9) The atmosphere is switched to dry $Ar/O_2$ gas from time $t_{b4}$. The reason for switching the atmosphere to the dry gas is that the oxide $MBa_2Cu_3O_6$ formed before time $t_{b4}$ is decomposed with water vapor at near 600° C., although the oxide is stable to water vapor at near 800° C.

(10) The temperature in the heat treatment furnace is continuously decreased from time $t_{b5}$ to time $t_{b6}$ (from 2 hours to 3 hours and 30 minutes) following the time $t_{b4}$ to time $t_{b5}$ (about 10 minutes). No changes occur in the oxide formed during this time period.

(11) The atmosphere is switched from dry $Ar/O_2$ gas to dry pure oxygen gas at time $t_{b6}$. $MBa_2Cu_3O_6$ is converted into $MBa_2Cu_3O_{7-x}$ (x is about 0.07) by annealing in pure oxygen, and an oxide superconductor is obtained. The temperature for switching to pure oxygen differs depending on the metal M. It is known that a good oxide superconductor may be obtained at 525° C. when M is Y, in a range form 425 to 525° C. when M is Sm, in the range of 375 to 475° C. when M is Nd, and in the range of 325 to 425° C. when M is La.

EXAMPLES

Example 1

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that molar ratio of metal ions is 1:2:3 to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1f) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1j), and was diluted using a measuring flask to obtain coating solution A with a concentration of 1.52M as reduced into the concentration of metal ions.

Coating solution B was obtained by adding 10 wt % of $H(CF_2)_8COOH$ to the coating solution A as an additive.

The coating solution A and coating solution B were placed in respective 100 cc beakers at a depth of about 30 mm. An oriented $LaAlO_3$ single crystal substrate with both surfaces polished was dipped into each beaker, and the substrate was withdrawn with a withdrawal speed of 5 mm/sec or 20 mm/sec. Four kinds of gel films were thus obtained. An index "a" is attached to the gel film obtained from the coating solution A, while an index "b" is attached to the gel film obtained from the coating solution B. An index "w05" is attached to the gel film obtained at a withdrawal speed of 5 mm/sec, while an index "w20" is attached to the gel film obtained at a withdrawal speed of 20 mm/sec. Accordingly, four kinds of the gel films obtained are referred to as G1aw05, G1aw20, G1bw05 and G1bw20, respectively.

The Gel films G1aw05, G1aw20, G1bw05 and G1bw20 were placed in respective calcining furnaces, and organic substances were decomposed by heat treatment under a moist oxygen atmosphere according to the temperature profile shown in FIG. 3 to obtain calcined films containing semi-transparent dark brown metal oxy-fluoride. These calcined films are referred to as C1aw05, C1aw20, C1bw05 and C1bw20, respectively. These calcined films had a thickness of about 400, 800, 400, and 800 nm, respectively.

While no cracks were appeared in the calcined film C1aw05 obtained form the coating solution A, cracks capable of being visually observed with a width of 0.1 mm or more and a length of 1 mm or more were produced on the calcined film C1aw20 obtained form the coating solution A. It is known that the critical thickness of the calcined film is about 600 nm that is about twice as large as the critical thickness of the fired film (about 300 nm). The result of C1aw20 supports that the film with a thickness of 800 nm that exceeds the critical thickness of the calcined film of 600 nm tends to produce cracks.

On the other hand, no cracks were produced in the calcined films C1bw05 and C1bw20 obtained from the coating solution B. This means that cracks were prevented from being produced by the organic substances added. No visually observable cracks with a width of 0.1 mm or more and a length of 1 mm or more were produced at all on these calcined films in a region except a region within 2 mm from the edge of the substrate. It may be expected that no cracks would be produced even by depositing on a larger area of substrate as long as no cracks are produced in the above-mentioned area. This is because the width of 6 mm is sufficiently large in the length and ratio relative to the thickness of 800 nm, and stress caused by contraction in the direction of the surface of the substrate may be relaxed in all regions. Accordingly, excellent superconducting properties may be expected by using the invention. In other words, good calcined films without any cracks are obtained on both surfaces of the substrate by adding an organic substance having a high fluorine content even when the films having a thickness greater than the critical thickness are deposited on both surfaces of the substrate using a high-purity solution.

Three calcined films of C1aw05, C1bw05 and C1bw20 except C1aw20 that produced cracks were placed in a firing furnace, and superconductors were obtained by applying firing according to the temperature profile shown in FIG. 4 and by oxygen-annealing.

Most cracks are formed on the film in the calcining process in the TFA-MOD method, and heat treatment proceeds by maintaining the configuration of the calcined film in the firing process. There were no films that produced cracks during the firing process in this example. These superconducting films (fired films) are referred to as F1aw05, F1bw05 and F1bw20.

The superconducting properties of the superconducting film obtained were measured by an inductive method in a self magnetic field in liquid nitrogen with CryoScan (manufactured by THEVA Co.). The thickness of the film was measured by destructive analysis by induced coupled plasma emission spectrometry (ICP) after the measurement by the inductive method.

The superconducting film F1aw05 obtained from the coating solution A had a thickness of 200 nm, and a Jc value was as high as 7.34 $MA/cm^2$ (77K, 0T).

The superconducting film F1bw05 obtained from the coating solution B had a thickness of 230 nm with the Jc value of 6.58 $MA/cm^2$ (77K, 0T), and degradation of the superconducting properties was insignificant even by adding the additive.

The superconducting film F1bw20 obtained from the coating solution B had a thickness of 500 nm with the Jc value of 5.26 $MA/cm^2$ (77K, 0T). It was shown that a superconductor showing an electric current of 263 A per 1 cm width could be obtained with the thickness formed by single coating as described above.

Example 2

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that the molar ratio of metal ions was 1:2:3 to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1f) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1j), and was diluted using a measuring flask to obtain coating solution 2A with a concentration of 1.52M as reduced into the concentration of metal ions.

Coating solution 2B was obtained by adding $H(CF_2)_8COOH$ to the coating solution 2A in a concentration of 10 wt % as an additive. The coating solution 2B was placed in a 100 cc beaker so that the depth of the solution was about 30 mm, an oriented $LaAlO_3$ single crystal substrate with both-side polished was dipped into each beaker, and the substrate was withdrawn with a withdrawal speed of 50 mm/sec on one minute after the dipping. Two samples of double-sided gel films G2b1w50 and G2b2w50 were obtained under the same condition as described above.

Each of the gel films G2b1w50 and G2b2w50 was placed in a calcining furnace, and organic substances were decomposed by heating in a moist oxygen atmosphere according to the temperature profile shown in FIG. 3 to obtain a calcined film made of a semi-transparent dark brown metal oxy-fluoride. These calcined films are referred to as C2b1w50 and C2b2w50.

Figure 5:
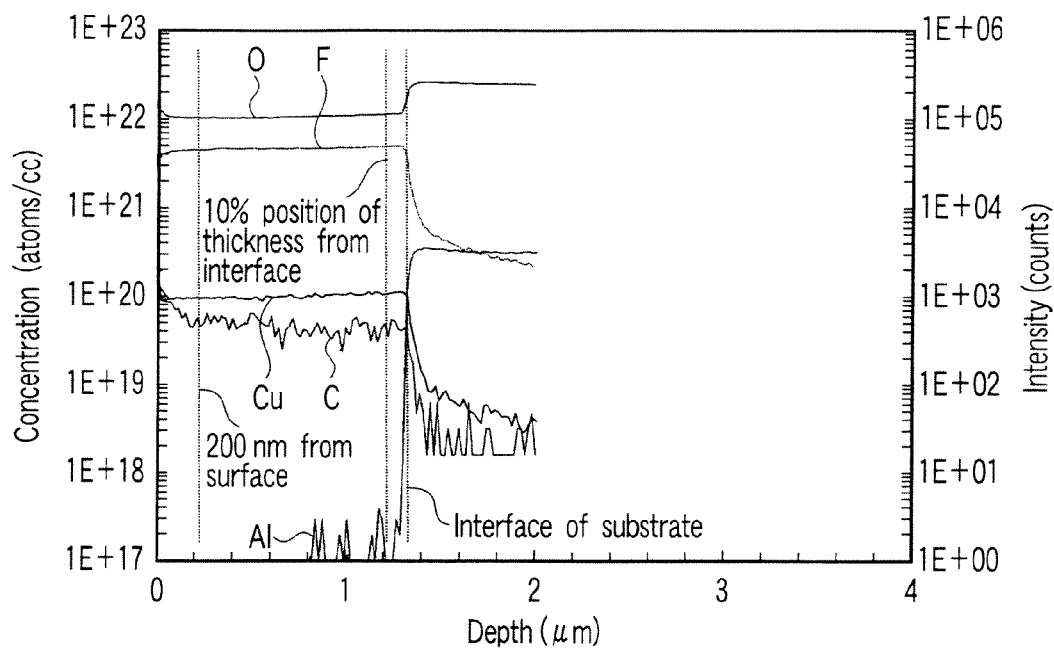
FIG. 5 is a graph showing a SIMS profile of a calcined film formed on the front surface of a substrate in Example 2.
Figure 6:
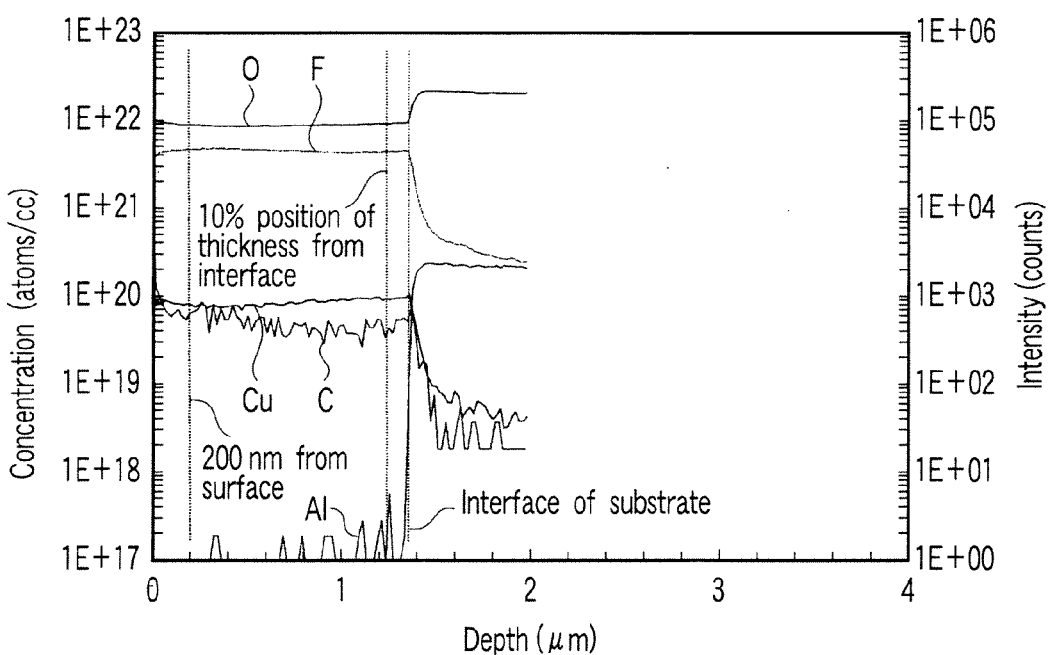
FIG. 6 is a graph showing a SIMS profile of a calcined film formed on the back surface of the substrate in Example 2.

FIGS. 5 and 6 show the results of compositional distribution in the direction from the surface to the substrate on the front surface and back face of C2b1w50, respectively, determined by SIMS analysis. A reference film was independently prepared by ion-implantation of fluorine and carbon, and fluorine and carbon in C2b1w50 were quantified with reference to the reference film. FIGS. 5 and 6 show that the distribution curves have similar tendency on the front surface and back surface.

The zero position on the horizontal axis denotes the surface of the film in FIGS. 5 and 6. The content of carbon is higher on the surface of the film than the inside of the film, because carbon dioxide in the air is adsorbed on the surface of the film. Since the surface of the superconducting film formed by the TFA-MOD method is rough, the effect of adsorption of $CO_2$ in the air extends to a depth of about 200 nm from the surface. It is also observed that the content of carbon is reduced by the order of 1.5 figures at a depth of 1.38 μm or more that is considered as an interface between the calcined film and single crystal substrate. This is due to a minute amount of remaining carbon component in the film originating from trifluoroacetic acid as a starting material of the TFA-MOD method. Such residual carbon is not observed in the precursor of the EB method.

With respect to the distribution of oxygen, fluorine and copper in FIGS. 5 and 6, it may be confirmed that analyzed values of these elements are quite stable in the region from a depth of 200 nm in the vicinity of the surface to a depth of 1240 nm where a portion corresponding to 10% of the thickness of the film is excluded from the interface. No abrupt change of the composition, which is specific to the film formed by repeated coatings and exceeds 5 times or more the concentration in the intermediate oxide layer, are observed in these drawings. This confirms that a uniform film can be formed by single coating.

The calcined film C2b2w50 was placed in a firing furnace, and a superconductor F2b2w50 was obtained by firing the calcined film according to the temperature profile shown in FIG. 4 followed by oxygen-annealing.

Superconducting properties of the superconductor obtained were measured by an inductive method in a self-magnetic field in liquid nitrogen with CryoScan (manufactured by THEVA Co.). The Jc values of F2b2w50 were 5.11 $MA/cm^2$ (77K, 0T) in the superconducting film on the front surface and 5.64 $MA/cm^2$ (77K, 0T) on the back surface.

FIGS. 7 and 8 show the results of measurement of the composition distribution in the direction from the surface to the substrate of the front surface and back surface, respectively, of F2b2w50 by SIMS analysis. FIGS. 7 and 8 show only the intensities since, unlike in FIGS. 5 and 6, no comparison is made based on a reference film prepared by ion-implantation of fluorine and carbon. The intensity is not always proportional to the amount of substances in the SIMS analysis.

FIG. 7 shows that the thickness of the superconducting film on the surface is about 660 nm, and no discontinuous planes are formed with respect to oxygen, fluorine and copper as in the calcined film. In other words, discontinuous changes of the amounts of components, which are observed in the superconducting film obtained by repeated coatings, are not observed in this superconducting film.

The thickness of the superconducting film on the back surface is about 600 nm, which is smaller than the thickness on the front surface. This difference corresponds to a difference of thickness in the range of about ±5% of the film formed by dip coating. No discontinuous changes of the amounts of components are observed in the superconducting film formed on the back surface of the substrate as in that on the front surface of the substrate.

As hitherto described, a superconductor with a thickness of more than 400 nm and having no discontinuous planes, which can be used as a superconducting filter, was obtained while superconducting properties of 5 $MA/cm^2$ (77K, 0T) or more was maintained. Such superconducting properties have been considered to be obtained from only a high-purity solution.

Example 3

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that molar ratio of metal ions is 1:2:3 to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1f) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1j), and was diluted using a measuring flask to obtain coating solution 3A with a concentration of 2.31M as reduced into the concentration of metal ions. According to our past report, it has been shown that the thickness of the film formed by dip coating is approximately doubled by using the coating solution of the above-mentioned concentration due to increased viscosity as compared with the film formed by using a coating solution with a concentration of 1.52M.

Coating solution 3B was obtained by adding $H(CF_2)_8COOH$ to the coating solution 3A in a concentration of 10 wt % as an additive. The coating solution 3B was placed in a 100 cc beaker so that the depth of the solution was about 30 mm, an oriented $LaAlO_3$ single crystal substrate with both-side polished was dipped into the beaker, and the substrate was withdrawn with a withdrawal speed of 50 mm/sec 1 minute after the dipping to obtain a double-sided gel film G3bw50.

The gel film G3bw50 was placed in a calcining furnace, and organic substances were decomposed by heating in a moist oxygen atmosphere according to the temperature profile shown in FIG. 3 to obtain a calcined film C3bw50 made of a semi-transparent dark brown metal oxy-fluoride.

Figure 9:
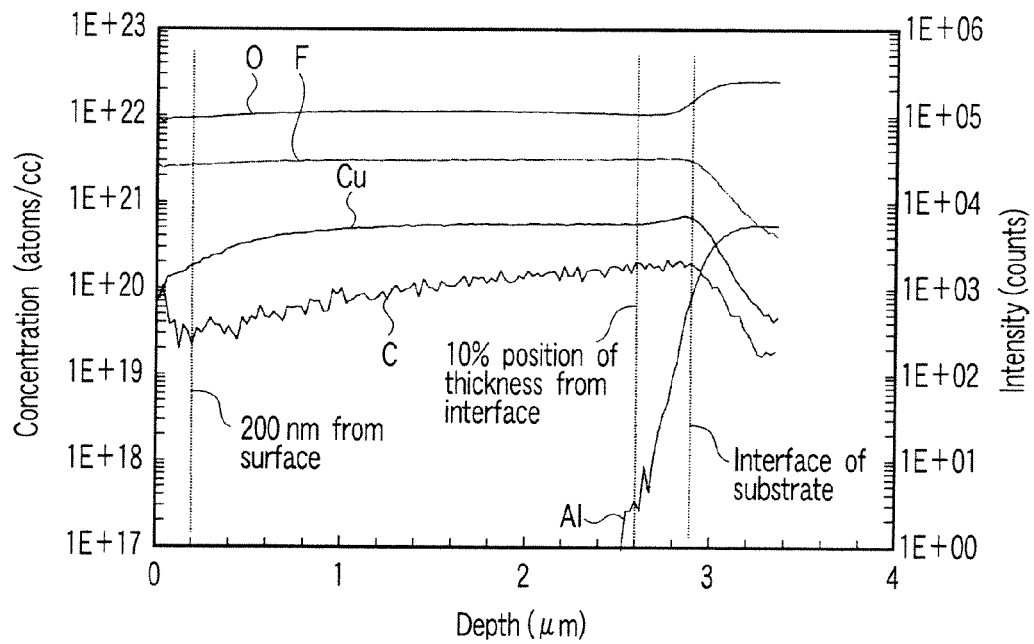
FIG. 9 is a graph showing a SIMS profile of a calcined film formed in Example 3.

FIG. 9 shows the result of measurement of the component distribution in the direction of the substrate from the surface by SIMS analysis of C3bw50. A reference film was independently prepared by ion-implantation of fluorine and carbon, and fluorine and carbon in C3bw50 film were quantified with reference to the reference film.

In FIG. 9, the position of zero on the horizontal axis denotes the surface of the film. The content of carbon is higher on the surface of the film than the inside of the film, because carbon dioxide in the air is adsorbed on the surface of the film. The content of carbon is gradually decreased at a depth of 2.9 μm or more that is considered to be the interface between the calcined film and the single crystal substrate. The rate of decrease in carbon content is more moderate in FIG. 9 than in FIGS. 5 and 6. This is because there are portions that arrive at the substrate and do not arrive at the substrate at a depth of 2.9 μm since the C3bw50 film is thick and has large surface roughness. Since the composition of the portion that arrives at the substrate is largely different from the composition of the portion that does not arrive at the substrate, reliability of the data decreases at a thickness of about 10% of the thickness from the interface between the film and substrate. Since the area where an excavated surface by SIMS analysis arrives at the surface of the substrate increases with time in this film, the amount of residual carbon as well as the amount of residual fluorine are gradually decreased at the portion corresponding to the inside of the substrate.

FIG. 9 shows that the amounts of oxygen, fluorine and copper do not rapidly change at a depth of 200 to 2,610 nm except the portion 200 nm from the surface of the film and the portion (290 nm) corresponding to 10% of the thickness from the interface between the film and substrate. This shows that a calcined film having a quite large thickness and having no discontinuous planes may be obtained. Such calcined film has been considered to be impossible to form by the TFA-MOD method.

Example 4

$Sm(OCOCH_3)_3$ hydrate was dissolved in ion-exchange water, and mixed with an equimolar amount of $CF_3CF_2COOH$ for reaction with stirring. This solution was placed in a round-bottom flask, and was allowed to react and to be purified for 12 hours in vacuum using a rotary evaporator to obtain a yellow powder. Solution 4PSSm (pre-solution Sm) was obtained by dissolving the powder in methanol.

After obtaining a pale purple powder from $Nd(OCOCH_3)_3$ hydrate, this powder was similarly dissolved in methanol to obtain solution 4PSNd.

$La(OCOCH_3)_3$, $Nd(OCOCH_3)_3$ and $Sm(OCOCH_3)_3$ were mixed in a proportion of 1:2:7. The mixture was dissolved in ion-exchange water, and was mixed with an equimolar amount of $CF_3CF_2COOH$ for reaction with stirring. This solution was placed in a round bottom flask, and was allowed to react and to be purified for 12 hours in vacuum using a rotary evaporator to obtain a yellow powder. 4PSMix was obtained by dissolving the powder in methanol.

Each of 4PSSm, 4PSNd and 4PSMix was completely dissolved in methanol (FIG. 1f) corresponding to 100 times by weight. Each solution was purified for 12 hours in vacuum using a rotary evaporator, and yellow, pale purple and yellow powders corresponding to 4PSSm, 4PSNd and 4PSMix, respectively, were obtained. These powders were dissolved in methanol to obtain solutions 4SSm, 4SNd and 4SMix, respectively.

On the other hand, each powder of hydrates of $Ba(OCOCH_3)_2$ and $Cu(OCOCH_3)_2$ was dissolved in ion-exchange water, and was mixed with an equimolar amount of $CF_3COOH$ for reaction with stirring. These solutions were mixed so that a molar ratio of metal ions was 2:3, to obtain a mixed solution. The mixed solution obtained was placed in a round-bottom flask, and was allowed to react and to be purified in vacuum for 12 hours using a rotary evaporator to obtain a semi-transparent blue gel or sol.

The gel or sol obtained was completely dissolved by adding methanol (FIG. 1f) corresponding to about 100 times the weight of the gel or sol. The thus obtained solution was purified in vacuum for 12 hours using a rotary evaporator to obtain a semi-transparent blue sol or gel. The gel or sol obtained was dissolved in methanol (FIG. 1j), and diluted using a measuring flask to obtain solution 4BaCu.

The solution 4BaCu was mixed with each of the solutions 4SSm, 4SNd and 4SMix, and coating solutions 4Sm, 4Nd and 4Mix were prepared so that the ratio of lanthanoid metal M (total molar number):Ba:Cu was 1:2:3.

An additive $H(CF_2)_8COOH$ (10 wt % each) was added to the coating solutions 4Sm, 4Nd and 4Mix to obtain coating solutions 4SmT, 4NdT and 4MixT, respectively. The coating solutions 4SmT, 4NdT and 4MixT were placed in respective 100 cc beakers at a depth of about 30 mm, an oriented $LaAlO_3$ single crystal substrate with both-side polished was dipped in each solution, and the substrate was withdrawn at a withdrawal speed of 50 mm/sec on one minute after the dipping. Two samples each of double-sided gel films G4Smw50, G4Ndw50 and G4Mixw50 were obtained under the same condition.

Each of the gel films G4Smw50, G4Ndw50 and G4Mixw50 was placed in a calcining furnace, and organic substances were decomposed by heating in a moist oxygen atmosphere according to the temperature profile shown in FIG. 3 to obtain a calcined film made of semi-transparent dark brown metal oxy-fluoride. These calcined films are referred to as C4Smw50, C4Ndw50 and C4Mixw50.

Compositional distribution was measured in the direction from the surface to the substrate by SIMS analysis with respect to each of C4Smw50, C4Ndw50 and C4Mixw50. The results show that, when the film was divided in plural regions for every depth of 20 nm from the surface of the film, the atomic ratio of copper, fluorine, oxygen or carbon between two adjacent regions was in the range of ⅕ to 5 times.

Each of C4Smw50, C4Ndw50 and C4Mixw50 was placed in a firing furnace, and was fired and annealed in oxygen according to the temperature profile shown in FIG. 4 to obtain superconductors F4Smw50, F4Ndw50 and F4Mixw50. The oxygen partial pressures for firing the calcined films C4Smw50, C4Ndw50 and C4Mixw50 were 20, 5 and 10 ppm, respectively. The temperature for starting oxygen-annealing was 350° C. for all the films, and the temperature was maintained for 4 hours.

Superconducting properties Jc and Tc of the superconducting film obtained were measured by an inductive method in a self magnetic field in liquid nitrogen with CryoScan (manufactured by THEVA Co.). The thickness of the film was measured by induced coupled plasma emission spectrometry (ICP) after the measurement by the inductive method. The results are shown in Table 1. It was confirmed from Table 1 that the thickness may be increased in the superconductor having high Tc while high Jc is maintained as in the yttrium-based superconductor.

TABLE 1

|  | Jc (77K, 0T) [MA/cm$^2$] | Tc [K] | Thickness [nm] |
|---|---|---|---|
| F4Smw50 | 4.2 | 94.0 | 520 |
| F4Ndw50 | 3.1 | 93.6 | 530 |
| F4Mixw50 | 2.7 | 93.7 | 510 |

Jc values were 4.2 MA/cm$^2$ (77K, 0T), 3.1 MA/cm$^2$ (77K, 0T) and 2.7 MA/cm$^2$ (77K, 0T), Tc values were 94.0K, 93.6K and 93.7K, and thicknesses were 520, 530 and 510 nm.

Example 5

Each powder of hydrates of Y(OCOCH$_3$)$_3$, Ba(OCOCH$_3$)$_2$ and Cu(OCOCH$_3$)$_2$ was dissolved in ion-exchange water, and was mixed with an equimolar amount of CF$_3$COOH for reaction with stirring. These solutions were mixed so that the molar ratio of metal ions is 1:2:3, to obtain a mixed solution. The mixed solution obtained was placed in a round-bottom flask, and was allowed to react and to be purified for 12 hours in vacuum using a rotary evaporator to obtain a semi-transparent blue gel or sol.

The gel or sol obtained was completely dissolved by adding methanol corresponding to 100 times the weight of the sol or gel (FIG. 1$f$), and the obtained solution was reacted and purified for 12 hours in vacuum using a rotary evaporator to obtain a semi-transparent blue sol or gel.

The gel or sol obtained was dissolved in methanol (FIG. 1$j$), and coating solution 5A with a concentration of 1.52M as reduced to metal ions was obtained by dilution using a measuring flask.

Solutions 5B01 to 5B37 were prepared by adding any one of the following compounds 01 to 37 to the coating solution 5A as an additive in a concentration of 10 wt %.

[01] F(CF$_2$)$_3$OCF(CF$_3$)CH$_2$OH
[02] F(CH$_2$)$_8$CH$_2$CH$_2$OH
[03] F(CH$_2$)$_{10}$CH$_2$CH$_2$OH
[04] C$_3$F$_7$OCF(CF$_3$)CF$_2$OCF(CF$_3$)CH$_2$OH
[05] (CF$_3$)$_2$CF(CF$_2$)$_4$CH$_2$CH$_2$OH
[06] (CF$_3$)$_2$CF(CF$_2$)$_6$CH$_2$CH$_2$OH
[07] H(CF$_2$)$_6$CH$_2$OH
[08] H(CF$_2$)$_8$CH$_2$OH
[09] F(CF$_2$)$_4$COOH
[10] F(CF$_2$)$_5$COOH
[11] F(CF$_2$)$_6$COOH
[12] F(CF$_2$)$_7$COOH
[13] F(CF$_2$)$_8$COOH
[14] F(CF$_2$)$_9$COOH
[15] F(CF$_2$)$_{10}$COOH
[16] F(CF$_2$)$_3$O[CF(CF$_3$)CF$_2$O]$_2$CF(CF$_3$)COF
[17] F(CF$_2$)$_3$O[CF(CF$_3$)CF$_2$O]$_3$CF(CF$_3$)COF
[18] H(CF$_2$)$_4$COOH
[19] H(CF$_2$)$_6$COOH
[20] H(CF$_2$)$_8$COOH
[21] HOOC(CF$_2$)$_3$COOH
[22] HOOC(CF$_2$)$_4$COOH
[23] HOOC(CF$_2$)$_6$COOH
[24] HOOC(CF$_2$)$_7$COOH
[25] (CF$_3$)$_2$C(CH$_3$)COOH
[26] (CF$_3$)$_2$C(CH$_3$)COF
[27] hexafluoroepoxy propane
[28] 3-perfluorohexyl-1,2-epoxy propane
[29] 3-perfluorooctyl-1,2-epoxy propane
[30] 3-perfluorodecyl-1,2-epoxy propane
[31] 3-(perfluoro-5-methylhexyl)-1,2-epoxy propane
[32] 3-(perfluoro-7-methylhexyl)-1,2-epoxy propane
[33] CF$_3$CH=CF$_2$
[34] F(CF$_2$)$_4$CH=CH$_2$
[35] F(CF$_2$)$_6$CH=CH$_2$
[36] F(CF$_2$)$_8$CH=CH$_2$
[37] F(CF$_2$)$_{10}$CH=CH$_2$ Each of the coating solutions 5B01 to 5B37 was placed in a 100 cc beaker at a depth of 30 mm, and an oriented LaAlO$_3$ single crystal substrate with both-side polished was dipped in each solution, and the substrate was withdrawn at a withdrawal speed of 50 mm/sec 1 minute after the dipping to obtain gel films 5G01w50 to 5G37w50.

Each of the gel films 5G01w50 to 5G37w50 was placed in a calcining furnace, and organic substances were decomposed by heating in a moist oxygen atmosphere according to the temperature profile shown in FIG. 3 to obtain a calcined film made of a semi-transparent dark brown metal oxy-fluoride.

The heat treatment temperature differs depending on the additives: the gel films were kept in the range of 170 to 220° C. when the additives [09] to [11], [18], [19] and [33] to [37] were used; in the range of 230 to 280° C. when the additives [01] to [08] and [21] to [24] were used; and in the range of 200 to 250° C. when the other additives were used. The calcined films are referred to as 5C01w50 to 5C37w50, respectively, hereinafter.

Each of the calcined films 5C01w50 to 5C37w50 was placed in a firing furnace, and was fired and annealed in oxygen according to the temperature profile shown in FIG. 4 to obtain superconductors 5F01w50 to 5F37w50.

Superconducting properties of each superconducting film obtained were measured by an inductive method in a self magnetic field in liquid nitrogen with CryoScan (manufactured by THEVA Co.). The thickness of the film was measured by destructive analysis by induced coupled plasma emission spectrometry (ICP) after the measurement by the inductive method. The superconducting films 5F01w50 to 5F37w50 had a thickness in the range of 400 to 650 nm, and a Jc value of 0.0 to 5.6 MA/cm$^2$ (77K, 0T).

In this case, the Jc value is related to the ratio (mol %) of atomic numbers of (fluorine)/(fluorine+hydrogen) in the additive molecule. This ratio is referred to as R$_F$. Table 2 shows the relation between the R$_F$ value of the additive and the Jc value of the superconducting film obtained. The data in Table 2 are summarized in FIG. 10.

TABLE 2

|  | Fluorine | Hydrogen | R$_F$ | Jc (77K, 0T) [MA/cm$^2$] |
|---|---|---|---|---|
| CF$_3$CF$_2$(CH$_2$)$_6$OH | 5 | 13 | 27.8% | 0.0 |
| F(CF$_2$)$_4$(CH$_2$)$_6$OH | 9 | 13 | 40.9% | 0.0 |
| CHF$_2$CF$_2$CH$_2$OH | 4 | 4 | 50.0% | 0.0 |
| CF$_3$CHFCF$_2$CH$_2$OH | 6 | 4 | 60.0% | 0.8 |

TABLE 2-continued

| | Fluorine | Hydrogen | $R_F$ | Jc (77K, 0T) [MA/cm$^2$] |
|---|---|---|---|---|
| F(CF$_2$)$_8$(CH$_2$)$_3$OH | 17 | 7 | 70.8% | 1.6 |
| H(CF$_2$)$_6$CH$_2$OH | 12 | 4 | 75.0% | 4.1 |
| H(CF$_2$)$_8$CH$_2$OH | 16 | 4 | 80.0% | 4.7 |
| C$_3$F$_7$OCF(CF$_3$)CF$_2$OCF(CF$_3$)CH$_2$OH | 17 | 3 | 85.0% | 5.1 |
| F(CF$_2$)$_4$COOH | 9 | 1 | 90.0% | 5.3 |
| F(CF$_2$)$_{10}$COOH | 21 | 1 | 95.5% | 5.6 |
| F(CF$_2$)$_3$O[CF(CF$_3$)CF$_{2O}$]$_2$CF(CF$_3$)COF | 24 | 0 | 100.0% | 5.8 |

Figure 10:
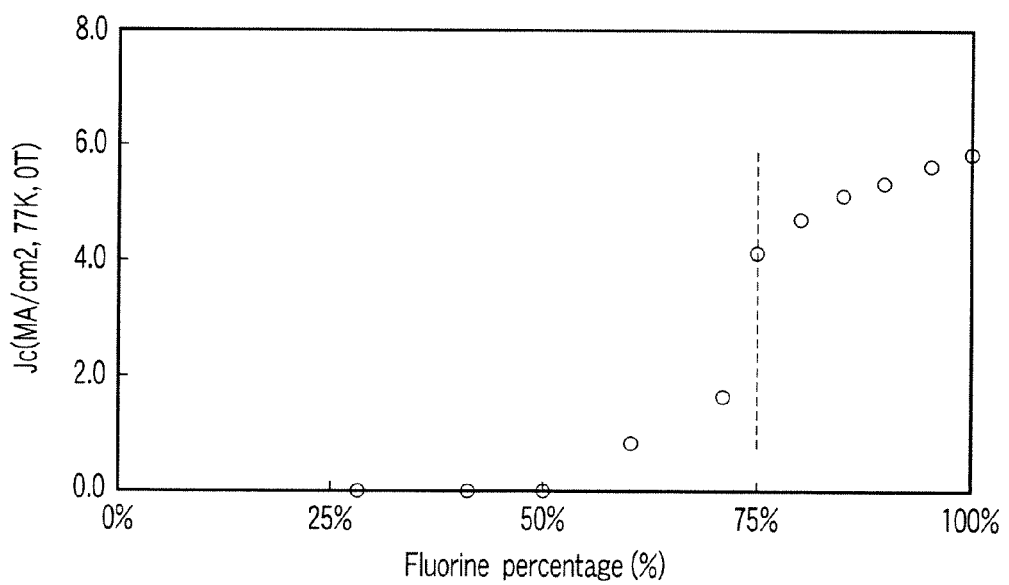
FIG. 10 is a graph showing a relation between $R_F$ and Jc of a superconducting film obtained in Example 5.

Table 2 and FIG. 10 show the following facts. The Jc value rapidly decreases when $R_F$ is less than 75%. Since additives containing a large amount of hydrogen remain in the film even after organic chains are broken as described above, oxygen in other oxides tends to be replaced with fluorine to increase the amount of residual fluorine to consequently degrade superconducting properties. Conversely, the effect of additives containing a small amount of hydrogen seems to give little influence since compounds of fluorides and hydrogen fluoride are formed and are dissipated in air. $R_F$ is preferably 75% or more for obtaining a superconductor that exhibits sufficient superconducting properties. Additives with $R_F$ of 90% or more are particularly preferable since superconducting films with Jc of 5.0 MA/cm$^2$ (77K, 0T) or more can be obtained. However, cracks are liable to occur when $R_F$ exceeds 96%. This may be supposed that, since additives containing too much fluorine do not form sufficient hydrogen bonds in the film, drying stress resistance of the film during decomposition of trifluoroacetate salt is so weakened that cracks are readily produced.

Compositional distribution in the direction from the surface of the film to the substrate was measured by SIMS analysis for each of the superconducting films 5F01w50 to 5F37w50. The results show that, when the film was divided into plural regions for every 10 nm from the film surface in the direction of thickness, except a region 100 nm or less from the surface of the film and a region corresponding to 10% of the thickness from the interface between the film and substrate, atomic ratios (average) of oxygen, fluorine and copper, respectively, between adjacent two regions were in the range of 1/5 to 5 times, and the concentration changes of these elements were continuous.

Example 6

Powders of hydrates of Y(OCOCH$_3$)$_3$, Ba(OCOCH$_3$)$_2$ and Cu(OCOCH$_3$)$_2$ were dissolved in ion-exchange water, and each solution was mixed with an equimolar amount of CF$_3$COOH for reaction with stirring. These solutions were mixed so that molar ratio of metal ions was 1:2:3, to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1*f*) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1*j*), and was diluted using a measuring flask to obtain coating solution 6A with a concentration of 1.52M as reduced into the concentration of metal ions.

The following organic compounds were provided as additives:

[07] H(CF$_2$)$_6$CH$_2$OH
[08] H(CF$_2$)$_8$CH$_2$OH
[09] F(CF$_2$)$_4$COOH
[10] F(CF$_2$)$_5$COOH
[11] F(CF$_2$)$_6$COOH
[13] F(CF$_2$)$_8$COOH
[15] F(CF$_2$)$_{10}$COOH
[18] H(CF$_2$)$_4$COOH
[19] H(CF$_2$)$_6$COOH
[20] H(CF$_2$)$_8$COOH

Coating solutions were obtained by adding 5 wt % each of two additives to the coating solution 6A. For example, a coating solution prepared by mixing 5 wt % each of the additives [07] and [09] is referred to as coating solution S0709. The decomposition temperature range was widened by mixing two additives in this manner, and stability against heat treatment tends to be increased.

Eleven coating solutions S0709, S0809, S0910, S0911, S0913, S0915, S1118, S1119, S1120, S0918 and S1318 were prepared in this example.

Each of the coating solutions was placed in a 100 cc beaker at a depth of 30 mm, an oriented LaAiO$_3$ single crystal substrate with both-side polished was dipped in each solution, and the substrate was withdrawn at a withdrawal speed of 50 mm/sec on one minute after the dipping to obtain gel films G0709, G0809, G0910, G0911, G0913, G0915, G1118, G1119, G1120, G0918 and G1318.

Each of the gel films G0709, G0809, G0910, G0911, G0913, G0915, G1118, G1119, G1120, G0918 and G1318 was placed in a calcining furnace, and organic substances were decomposed in a moist oxygen atmosphere according to the temperature profile shown in FIG. 3 to obtain a calcined film made of semi-transparent dark brown metal oxy-fluoride. Each gel film was kept in a selected heat temperature range of 50° C. between 170° C. and 240° C., depending on the additive, for a long period. For example, G0709, G0809, G0910, G0911, G0913 and G0915 were maintained at 180 to 230° C., G1119 and G1120 were maintained at 190 to 240° C., and the others were maintained at 170 to 220° C. These calcined films are referred to as C0709, C0809, C0910, C0911, C0913, C0915, C1118, C1119, C1120, C0918 and C1318.

Each of these calcined films was placed in a firing furnace, and was fired and annealed in oxygen according to the temperature profile shown in FIG. 4 to obtain superconducting films F0709, F0809, F0910, F0911, F0913, F0915, F1118, F1119, F1120, F0918 and F1318.

Superconducting properties of each superconducting film were measured by an inductive method in a self magnetic field in liquid nitrogen with CryoScan (manufactured by THEVA Co.). The thickness of the film was measured by destructive analysis by induced coupled plasma emission spectrometry (ICP) after the measurement by the inductive method. The results are shown in Table 3.

TABLE 3

|       | Jc (77K, 0T) [MA/cm$^2$] | Thickness [nm] |
|-------|--------------------------|----------------|
| F0709 | 4.7                      | 410            |
| F0809 | 4.9                      | 440            |
| F0910 | 4.8                      | 460            |
| F0911 | 5.1                      | 470            |
| F0913 | 5.3                      | 480            |
| F0915 | 5.4                      | 500            |
| F1118 | 4.8                      | 480            |
| F1119 | 5.1                      | 500            |
| F1120 | 5.3                      | 520            |
| F0918 | 4.4                      | 420            |
| F1318 | 4.8                      | 470            |

The compositional distribution was measured by SIMS analysis in the direction from the surface to the substrate with respect to each of the superconducting films F0709, F0809, F0910, F0911, F0913, F0915, F1118, F1119, F1120, F0918 and F1318. The results show that, when the film was divided into plural regions for every 10 nm from the film surface in the direction of thickness, except a region 100 nm or less from the surface of the film and a region corresponding to 10% of the thickness from the interface between the film and substrate, atomic ratios (average) of oxygen, fluorine and copper, respectively, between adjacent two regions were in the range of ⅕ to 5 times, and the concentration changes of these elements were continuous. It is also shown that the decomposition temperature slightly decreases and the decomposition temperature range tends to be broad when two kinds of additives were mixed and added, and excellent superconducting properties are obtained with a thick superconducting film.

Example 7

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that molar ratio of metal ions was 1:2:3, to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1f) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1j), and was diluted using a measuring flask to obtain coating solution 7A with a concentration of 1.52M as reduced into the concentration of metal ions.

The following organic compounds were provided as additives:
[01] $F(CF_2)_4COOH$
[02] $F(CF_2)_5COOH$
[03] $F(CF_2)_6COOH$
[04] $F(CF_2)_7COOH$
[05] $F(CF_2)_8COOH$
[06] $F(CF_2)_9COOH$
[07] $F(CF_2)_{10}COOH$
[08] $HOOC(CF_2)_4COOH$
[09] $HOOC(CF_2)_6COOH$
[10] $HOOC(CF_2)_7COOH$
[11] $(CF_3)_2C(CH_3)COOH$
[12] $(CF_3)_2C(CH_3)COF$ A coating solution was obtained by adding 10 additives of the above-mentioned additives in an amount of 1 wt % each (10 wt % in total) to the coating solution 7A. The mixed additives were a mixture of [01] to [10]; a mixture of [01] to [09] and [11]; and a mixture of [01] to [09] and [12]. The coating solutions obtained are referred to as coating solutions 7X, 7Y and 7Z.

Each of the coating solutions was placed in a 100 cc beaker at a depth of 30 mm, an oriented $LaAlO_3$ single crystal substrate with both-side polished was dipped in each solution, and the substrate was withdrawn at a withdrawal speed of 50 mm/sec on one minute after the dipping to obtain gel films G7X, G7Y and G7Z.

Each of the gel films G7X, G7Y and G7Z was placed in a calcining furnace, and organic substances were decomposed in a moist oxygen atmosphere according to the temperature profile shown in FIG. 3 to obtain a calcined film made of semi-transparent dark brown metal oxy-fluoride. The heat treatment temperature was in the range of 180 to 230° C., and the temperature was maintained for a long period. These calcined films are referred to as C7X, C7Y and C7Z. It was confirmed that the film may be stably formed up to the periphery of the film when plural additives were used by mixing. The optimum decomposition temperature was decreased by 20° C.

Each of the calcined films C7X, C7Y and C7Z was placed in a firing furnace, and was fired and annealed in oxygen according to the temperature profile shown in FIG. 4 to obtain superconducting films F7X, F7Y and F7Z.

Superconducting properties of each superconducting film were measured by an inductive method in a self magnetic field in liquid nitrogen with CryoScan (manufactured by THEVA Co.). The thickness of the film was measured by destructive analysis by induced coupled plasma emission spectrometry (ICP) after the measurement by the inductive method. The results are shown in Table 4.

TABLE 4

|     | Jc (77K, 0T) [MA/cm$^2$] | Thickness [nm] |
|-----|--------------------------|----------------|
| F7X | 5.6                      | 510            |
| F7Y | 5.8                      | 520            |
| F7Z | 6.0                      | 510            |

The compositional distribution was measured by SIMS analysis in the direction from the surface to the substrate with respect to each of the superconducting films F7X, F7Y and F7Z. The results show that, when the film was divided into plural regions for every 10 nm from the film surface in the direction of thickness, except a region 100 nm or less from the surface of the film and a region corresponding to 10% of the thickness from the interface between the film and substrate, atomic ratios (average) of oxygen, fluorine and copper, respectively, between adjacent two regions were in the range of ⅕ to 5 times, and the concentration changes of these elements were continuous.

Example 8

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that molar ratio of metal ions was 1:2:3, to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1*f*) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1*j*), and was diluted using a measuring flask to obtain coating solution 8A with a concentration of 1.52M as reduced into the concentration of metal ions.

Ten wt % of $F(CF_2)_4COOH$ or $H(CF_2)_4COOH$ was added to the coating solution 8A as an additive to obtain coating solutions 8F and 8H.

Each of the coating solutions was placed in a 100 cc beaker at a depth of 30 mm, an oriented $LaAlO_3$ single crystal substrate with both-side polished was dipped in each solution, and the substrate was withdrawn at a withdrawal speed of 5 mm/sec on one minute after the dipping to obtain gel films G8F and G8H. The withdrawal speed was reduced because, when the withdrawal speed was increased for increasing the thickness of the film, a good film could not be formed in the G8H sample. Under such circumstances, the slow withdrawal speed was selected for comparing the effects of both additives.

Each of the gel films G8F and G8H was placed in a calcining furnace, and organic substances were decomposed by heating in a moist oxygen atmosphere according to the temperature profile shown in FIG. 3 to obtain a calcined film made of semi-transparent dark brown metal oxy-fluoride. These calcined films are referred to as C8F and C8H.

Each of the calcined films C8F and C8H was placed in a firing furnace, and was fired and annealed in oxygen according to the temperature profile shown in FIG. 4 to obtain superconducting films F8F and F8H.

Superconducting properties of each superconducting film obtained were measured by an inductive method in a self magnetic field in liquid nitrogen with CryoScan (manufactured by THEVA Co.). The thickness of the film was measured by destructive analysis by induced coupled plasma emission spectrometry (ICP) after the measurement by the inductive method. Jc values (77K, 0T) of the superconducting films F8F and F8H were 6.2 and 0.0 $MA/cm^2$, respectively, with the same thickness of 170 nm. The results show that the film F8H was not a superconductor.

Figure 11:
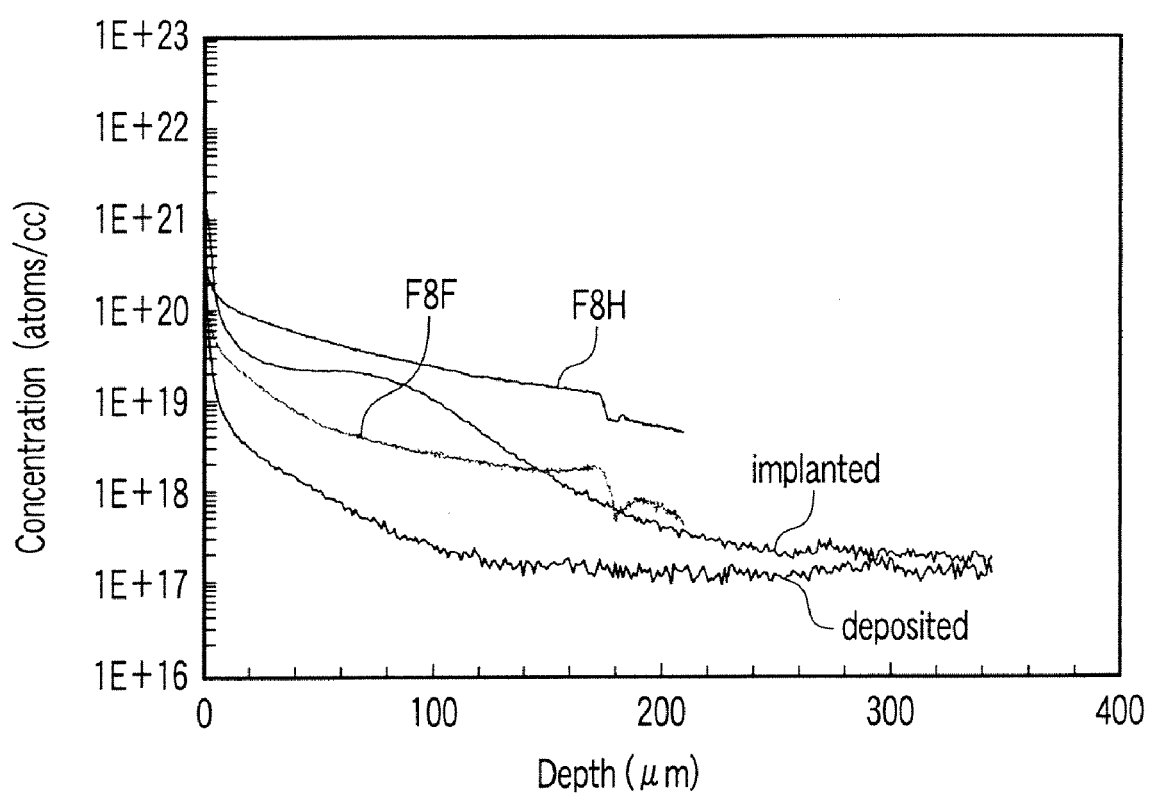
FIG. 11 is a graph showing the changes of fluorine concentration depending on additives in the superconducting film obtained in Example 8.
Figure 12:
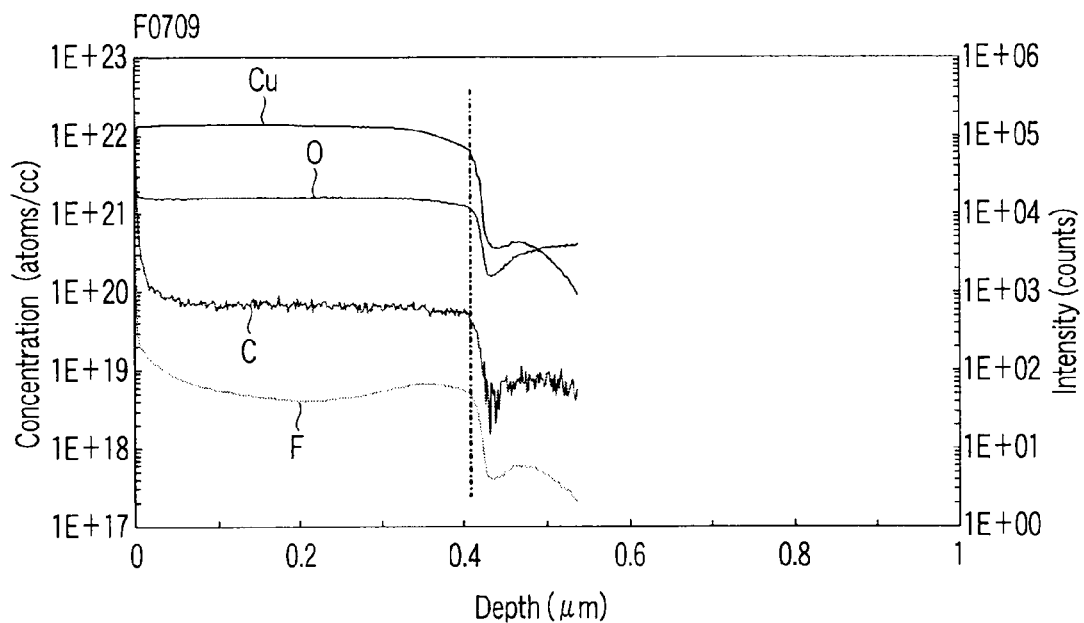
FIG. 12 is a graph showing the compositional distribution measured by SIMS analysis in the direction from the surface to the substrate with respect to superconducting film F0709.
Figure 13:
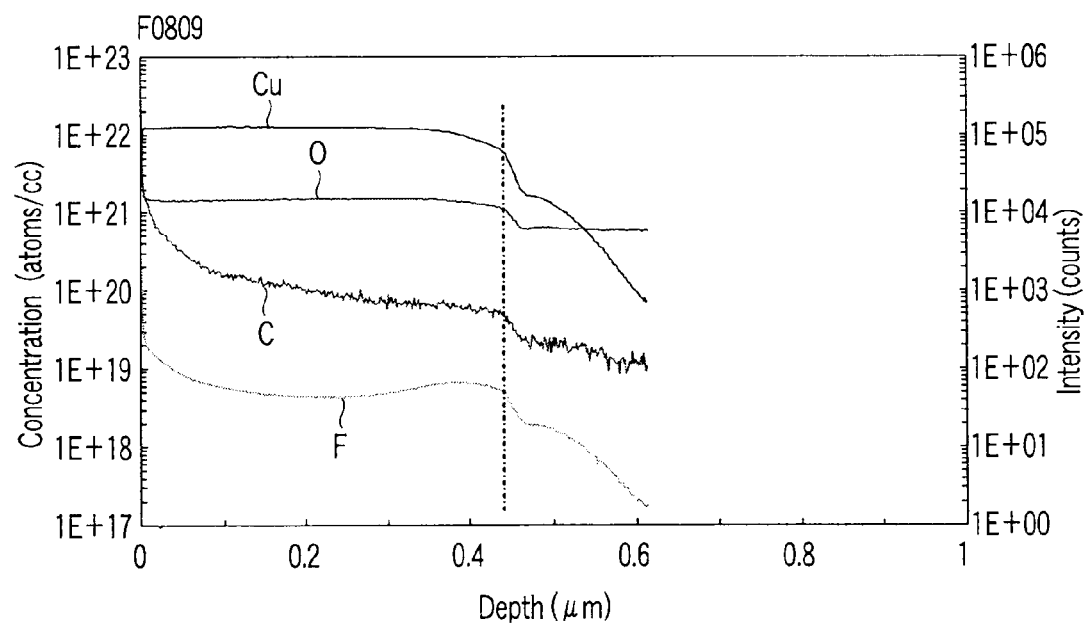
FIG. 13 is a graph showing the compositional distribution measured by SIMS analysis in the direction from the surface to the substrate with respect to superconducting film F0809.
Figure 14:
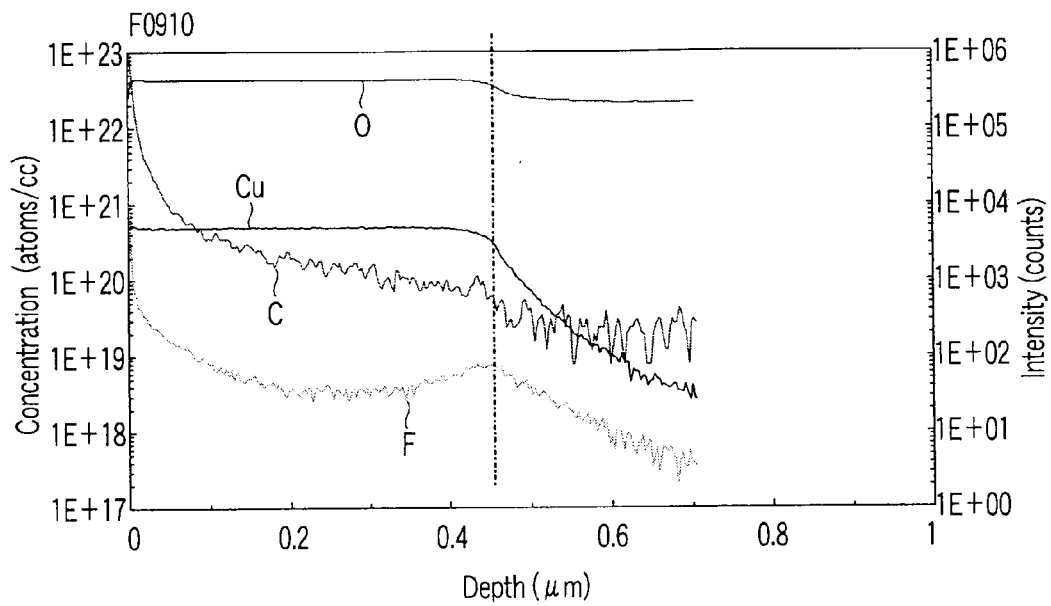
FIG. 14 is a graph showing the compositional distribution measured by SIMS analysis in the direction from the surface to the substrate with respect to superconducting film F0910.
Figure 15:
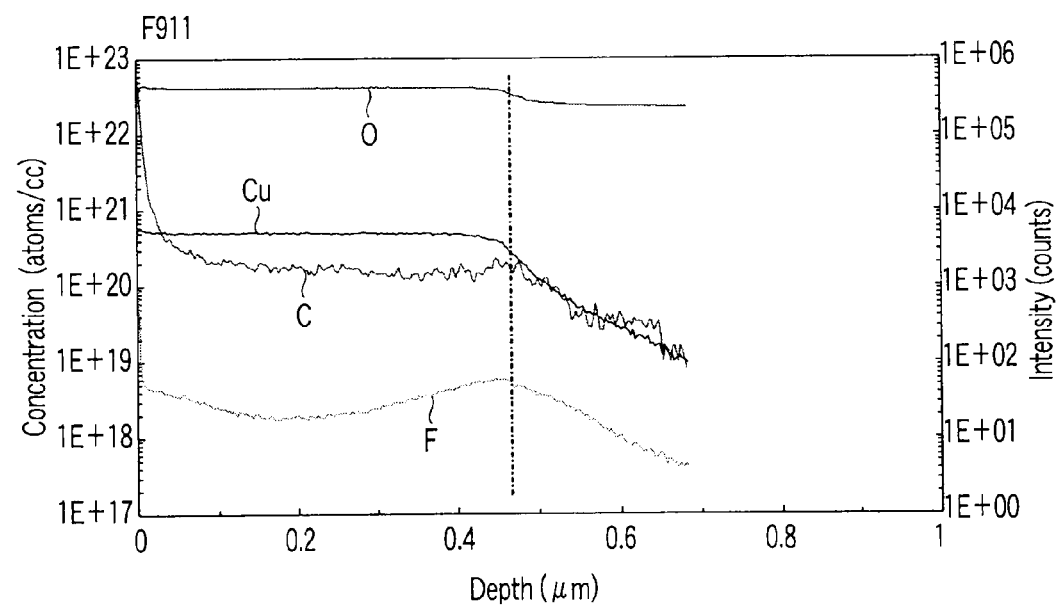
FIG. 15 is a graph showing the compositional distribution measured by SIMS analysis in the direction from the surface to the substrate with respect to superconducting film F0911.
Figure 16:
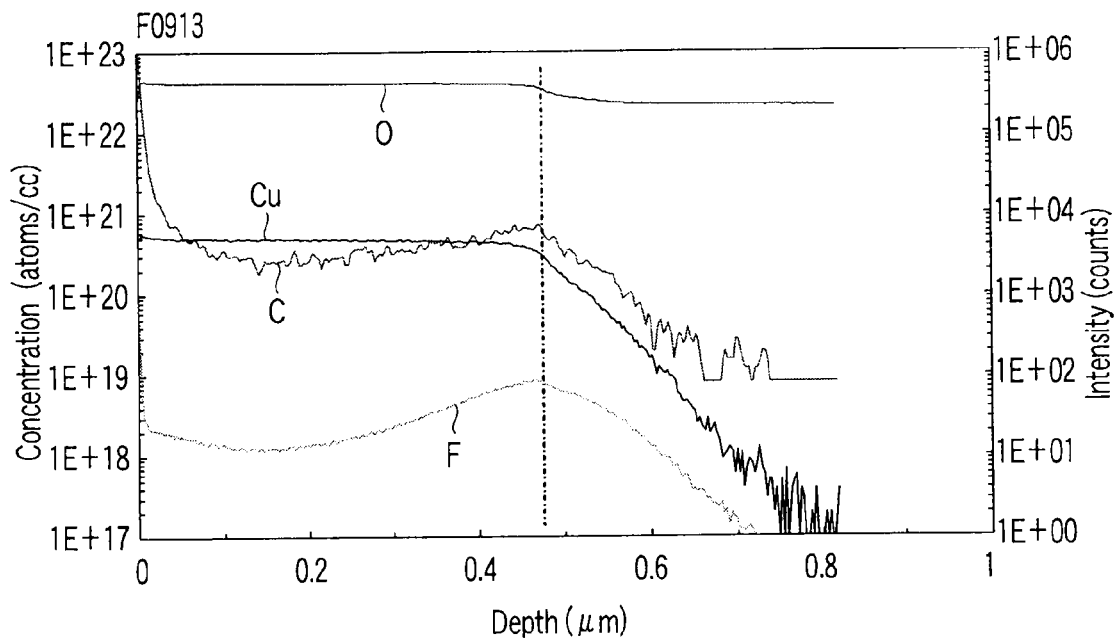
FIG. 16 is a graph showing the compositional distribution measured by SIMS analysis in the direction from the surface to the substrate with respect to superconducting film F0913.
Figure 17:
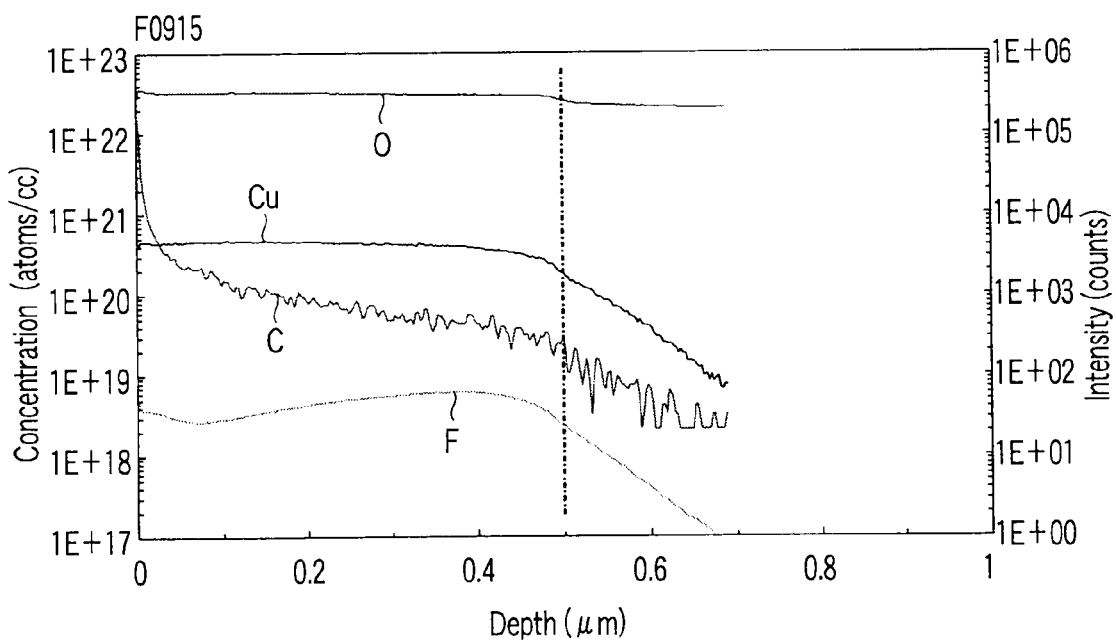
FIG. 17 is a graph showing the compositional distribution measured by SIMS analysis in the direction from the surface to the substrate with respect to superconducting film F0915.
Figure 18:
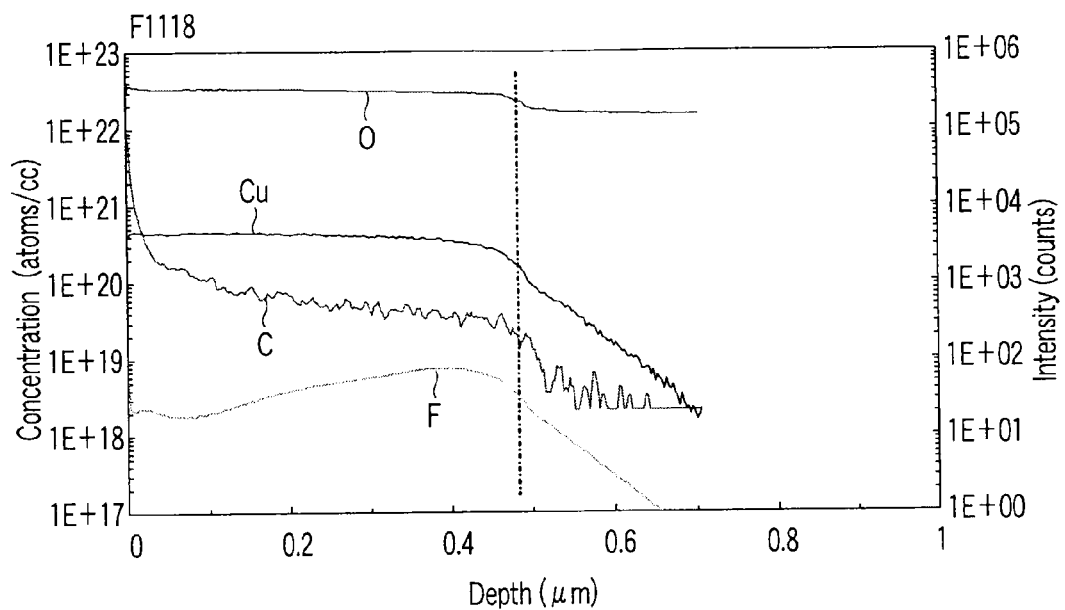
FIG. 18 is a graph showing the compositional distribution measured by SIMS analysis in the direction from the surface to the substrate with respect to superconducting film F1118.
Figure 19:
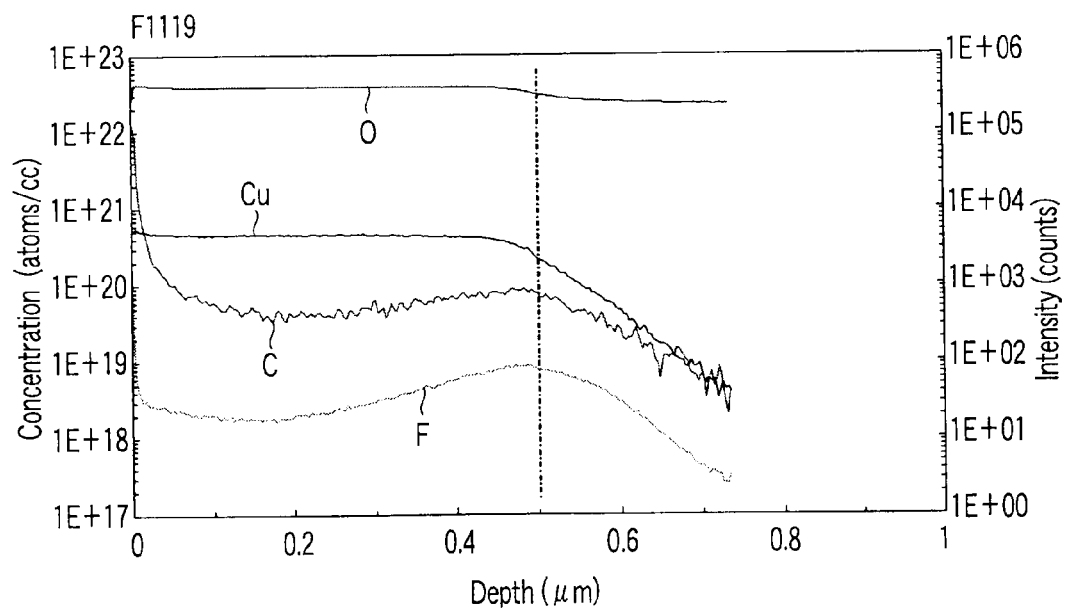
FIG. 19 is a graph showing the compositional distribution measured by SIMS analysis in the direction from the surface to the substrate with respect to superconducting film F1119.
Figure 20:
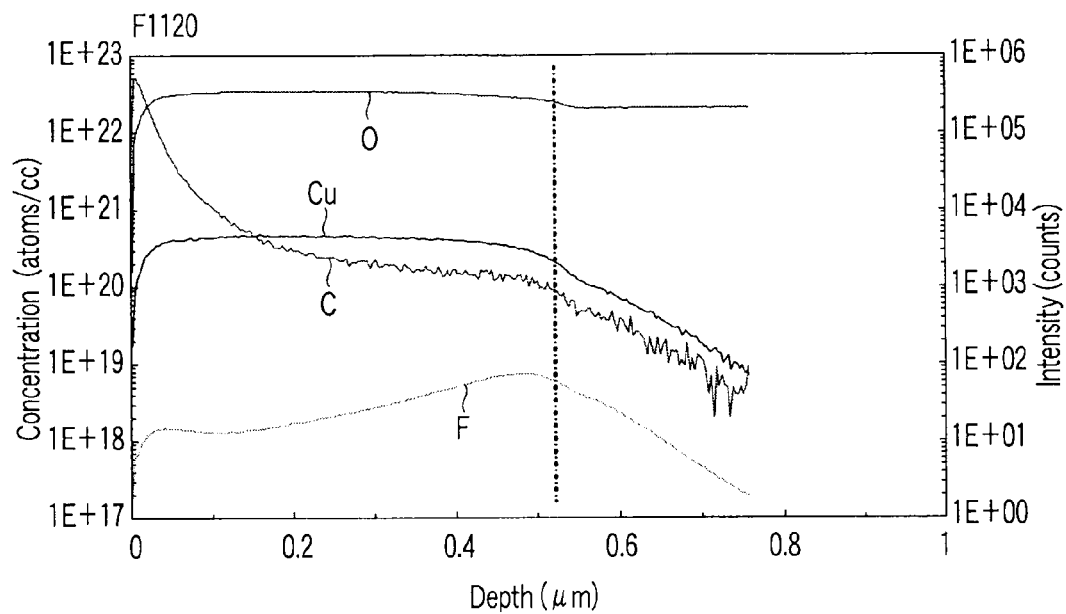
FIG. 20 is a graph showing the compositional distribution measured by SIMS analysis in the direction from the surface to the substrate with respect to superconducting film F1120.
Figure 21:
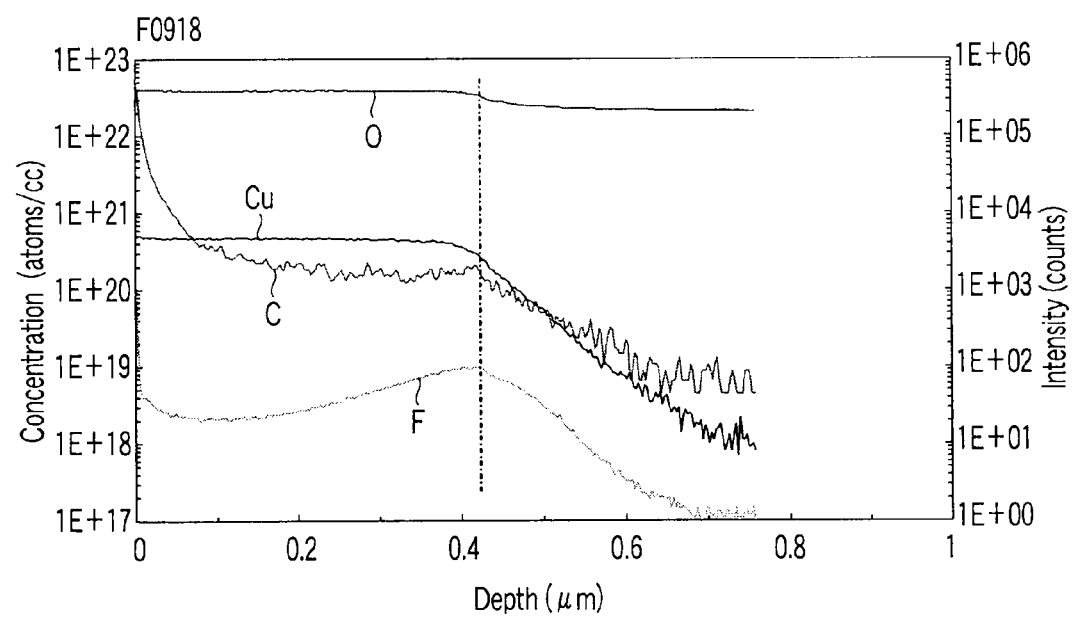
FIG. 21 is a graph showing the compositional distribution measured by SIMS analysis in the direction from the surface to the substrate with respect to superconducting film F0918.
Figure 22:
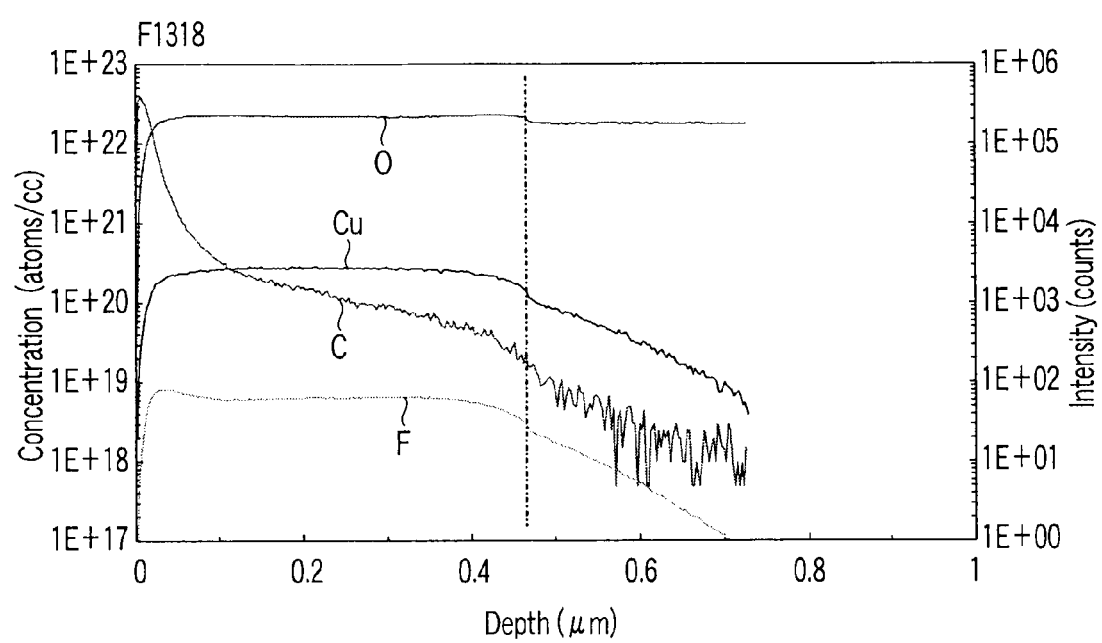
FIG. 22 is a graph showing the compositional distribution measured by SIMS analysis in the direction from the surface to the substrate with respect to superconducting film F1318.

Fluorine distribution in F8F and F8H in the direction of the substrate from the surface was measured by SIMS analysis. The results are shown in FIG. 11. The results of a physical vapor deposition film (deposited) and a physical vapor deposition film with fluorine ion-implantation (implanted) are also shown in FIG. 11.

The amount of fluorine gradually decreased from the surface of the film in F8F, and the concentration of fluorine tended to be about 10 times of the background level inside the film. It has been found that, when $F(CF_2)_4COOH$ is used as the additive, the amount of residual fluorine is approximately the same as in FIG. 11 even by increasing the thickness of the film by increasing the withdrawal speed. This shows that the amount of fluorine may be effectively reduced in the superconductor by using $F(CF_2)_4COOH$ as the additive.

It is also shown that fluorine remains in F8H in an amount about 10 times of F8F. The amount of elimination of fluorine is quite small even by forming the quasi-liquid phase network during the firing process when $H(CH_2)_4COOH$ is used as the additive, and the obtained superconducting film contains a large amount of fluorine. Since the perovskite structure of the superconductor is disrupted by forming $BaF_2$ through recrystallization when the temperature decreases after the firing process in the superconducting film containing fluorine, superconducting properties are significantly degraded to 1/10 or less of the film containing a small amount of fluorine.

The amount of residual fluorine was 2 to 3 times of the amount in FIG. 11 assuming that the thickness of F8H is 300 nm that is close to the critical thickness. This may be ascribed to obstruction of dissipation of fluorine compounds by hydrogen atoms as a result of increased thickness. Fluorine located far from the surface tends to remain, and this gives good elucidation that superconducting properties are degraded when the amount of residual fluorine increases.

It may be reasonably presumed that a high-purity solution containing no acetate salts having many hydrogen atoms is indispensable for obtaining thick superconductor with few fluorine residues. This is because the residual amount of fluorine increases when acetate salts having many hydrogen atoms are co-existent. This tendency becomes remarkable as the thickness of the film increases. When organic compounds having many hydrogen atoms remain in an initial solution, the amount of residual fluorine in the superconducting film increases according to film thickness, and superconducting properties are degraded.

Example 9

Powders of hydrates of $Y(OCOCH_3)_3$, $Ba(OCOCH_3)_2$ and $Cu(OCOCH_3)_2$ were dissolved in ion-exchange water, and each solution was mixed with an equimolar amount of $CF_3COOH$ for reaction with stirring. These solutions were mixed so that a molar ratio of metal ions was 1:2:3, to obtain a mixed solution. The mixed solution obtained was placed in a round-bottom flask, and was allowed to react for 12 hours in vacuum with purification using a rotary evaporator to obtain a semi-transparent blue gel or sol.

A solution, which was obtained by completely dissolving the gel or sol by adding methanol (FIG. 1*f*) corresponding to 100 times the weight of the gel or sol, was purified in vacuum for 12 hours using a rotary evaporator to obtain a semi-transparent blue gel or sol.

The gel or sol obtained was dissolved again in methanol (FIG. 1*j*), and was diluted using a measuring flask to obtain coating solutions 9A, 9B and 9C with concentrations of 1.52M, 2.31M and 2.78M, respectively, as reduced into the concentration of metal ions.

$H(CF_2)_4COOH$ as an additive was added to each of the coating solutions 9A, 9B and 9C in a proportion of 1.0, 1.5, 2.0, 2.5, 3.0, 4.0, 5.0, 6.0, 8.0, 10, 15, 20, 25 or 30 wt % to obtain coating solutions. A coating solution containing 1.5 wt % of the additive added to the solution 9C is referred to, for example, as 9C1.5.

Each of the coating solutions was placed in a 100 cc beaker at a depth of 30 mm, an oriented $LaAlO_3$ single crystal substrate with both-side polished was dipped in each solution, and the substrate was withdrawn at a withdrawal speed of 5 to 50 mm/sec on one minute after the dipping to obtain gel films. The gel film obtained by withdrawing the substrate at a withdrawal speed of 20 mm/sec from the solution 9C1.5 is referred to, for example, as G9C1.5w20.

Each of gel films G8F and G8H was placed in a calcining furnace, and organic substances were decomposed by heating in a moist oxygen atmosphere according to the temperature profile shown in FIG. 3 to obtain a calcined film made of semi-transparent dark brown metal oxy-fluoride. The calcined film manufactured from the gel film G9C1.5w20 is referred to, for example, as C9C1.5w20.

Each of the calcined films was placed in a firing furnace, and was fired and annealed in oxygen according to the temperature profile shown in FIG. 4 to obtain a superconducting film. The superconducting film obtained from the calcined film C9C1.5w20 is referred to, for example, as F9C1.5w20.

Occurrence of cracks was investigated for each calcined film. When the amount of the additive was 2.0 wt % or less, occurrence of cracks was confirmed in the superconducting films (for example C9A2.0w15, C9B2.0w15 and C9C2.0w15) having a thickness of about 350 nm and manufactured at a withdrawal speed of 15 mm/sec. Similar tendency was shown when the amount of the additive was 2.0 wt % or less irrespective of the concentration of the solution. On the other hand, the effect of increasing the thickness of the film was supposed to be exhibited when the amount of the additive was 2.5 wt % or more.

Superconducting properties of the superconducting film (for example C9A25w20) with amount of additive over 20 wt % were poor, although no cracks were produced. Superconducting properties are degraded because the ratio of total amount of additive material is relative large in case of the salts. This tendency was similar in the range where the amount of the additive exceeded 20 wt % irrespective of the concentration of the solution.

These results suggest that the ratio between trifluoroacetate salt and additive in the gel film is important for increasing the thickness of the superconducting film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxide superconductor film formed on a substrate, comprising:
    an oxide containing at least one metal M selected from the group consisting of yttrium and lanthanoid metals, provided that cerium, praseodymium, and promethium are excluded, and barium and copper,
    wherein the film has an average thickness of 350 nm or more, an average amount of residual carbon of $3 \times 10^{19}$ atoms/cc or more, and an amount of residual fluorine in a range of $5 \times 10^{17}$ to $1 \times 10^{19}$ atoms/cc, and
    wherein, when divided the film into a plurality of regions from a surface of the film or from an interface between the film and the substrate, each region having a thickness of 10 nm, atomic ratios of copper, fluorine, oxygen and carbon between two adjacent regions are in a range of ⅕ times to 5 times.

2. The oxide superconductor film according to claim 1, wherein the film has no cracks with a width of 0.1 mm or more and a length of 1 mm or more in a region except a region within 2 mm from an edge of the substrate.

3. The oxide superconductor film according to claim 1, wherein an atomic ratio of metal M, barium and copper is about 1:2:3.

4. The oxide superconductor film according to claim 1, wherein the film has an average thickness of 600 nm or more.

5. The oxide superconductor film according to claim 4, wherein the film has an average thickness of 1,250 nm or more.

6. The oxide superconductor film according to claim 1, wherein, when divided the film into a plurality of regions from the surface of the film or from the interface between the film and the substrate, each region having a thickness of 10 nm, atomic ratios of copper, fluorine, oxygen and carbon between two adjacent regions are in a range of ⅓ times to 3 times.

* * * * *